(12) United States Patent
Park et al.

(10) Patent No.: US 11,990,372 B2
(45) Date of Patent: May 21, 2024

(54) METHODS OF MANUFACTURING SEMICONDUCTOR CHIP INCLUDING CRACK PROPAGATION GUIDE

(71) Applicant: SK hynix Inc., Icheon-si (KR)

(72) Inventors: In Su Park, Icheon-si (KR); Jung Dal Choi, Icheon-si (KR)

(73) Assignee: SK hynix inc., Icheon-si (KR)

( * ) Notice: Subject to any disclaimer, the term of this patent is extended or adjusted under 35 U.S.C. 154(b) by 234 days.

(21) Appl. No.: 17/707,282

(22) Filed: Mar. 29, 2022

(65) Prior Publication Data

US 2022/0319924 A1    Oct. 6, 2022

(30) Foreign Application Priority Data

Apr. 5, 2021  (KR) .......................... 10-2021-0044325

(51) Int. Cl.
*H01L 21/78*  (2006.01)
*H01L 21/71*  (2006.01)
*H10B 43/27*  (2023.01)

(52) U.S. Cl.
CPC .............. *H01L 21/78* (2013.01); *H01L 21/71* (2013.01); *H10B 43/27* (2023.02)

(58) Field of Classification Search
None
See application file for complete search history.

(56) References Cited

U.S. PATENT DOCUMENTS

| 2009/0146260 | A1* | 6/2009 | Eto ...................... H01L 23/585 438/622 |
| 2010/0025824 | A1* | 2/2010 | Chen ..................... H01L 21/78 257/E21.214 |
| 2013/0020674 | A1* | 1/2013 | Leal ..................... H01L 23/585 257/E23.149 |
| 2021/0091045 | A1* | 3/2021 | Heo .................... H01L 23/3142 |
| 2021/0210458 | A1* | 7/2021 | Lee ......................... H01L 24/05 |

FOREIGN PATENT DOCUMENTS

| JP | 2011222939 A | * | 11/2011 | ............. H01L 21/78 |
| KR | 1020180104261 A |   | 9/2018  |                         |

OTHER PUBLICATIONS

Machine Translation of JP-2011222939-A (Year: 2011).*

* cited by examiner

*Primary Examiner* — Shamim Ahmed
(74) *Attorney, Agent, or Firm* — WILLIAM PARK & ASSOCIATES LTD.

(57) ABSTRACT

There may be provided a method of manufacturing a semiconductor chip. A layer stack in which first material layers and second material layers are alternately stacked is formed on a semiconductor substrate that includes a chip region and a scribe lane region, and crack propagation guides are formed in a first portion of the layer stack within the scribe lane region.

21 Claims, 50 Drawing Sheets

METHODS OF MANUFACTURING SEMICONDUCTOR CHIP INCLUDING CRACK PROPAGATION GUIDE

CROSS-REFERENCE TO RELATED APPLICATIONS

The present application claims priority under 35 U.S.C 119(a) to Korean Applications No. 10-2021-0044325, filed on Apr. 5, 2021, which is incorporated herein by reference in its entirety.

BACKGROUND

1. Technical Field

The present disclosure generally relates to a semiconductor technology and, more particularly, to methods of manufacturing a semiconductor chip including a crack propagation guide.

2. Related Art

Semiconductor devices are integrated on a substrate such as a wafer. Attempts have been made to three-dimensionally integrate semiconductor devices on a substrate. In order to increase the degree of integration of memory cells, three-dimensional semiconductor devices have been tried. Semiconductor chips including semiconductor devices may be separated from a substrate by dicing the substrate. In order to reduce damage that may be caused to a semiconductor device when the semiconductor chips are separated, various types of dicing techniques have been tried. For example, dicing techniques with a laser have been tried.

SUMMARY

According to an embodiment of the present disclosure, there may be provided a method of manufacturing a semiconductor chip including: forming a layer stack in which a first material layer and a second material layer are alternately stacked over a semiconductor substrate that includes a chip region and a scribe lane region; and forming crack propagation guides in a first portion of the layer stack within the scribe lane region.

According to another embodiment of the present disclosure, there may be provided a method of manufacturing a semiconductor chip including: forming a first layer stack in which first material layers and second material layers are alternately stacked over a semiconductor substrate that includes a chip region and a scribe lane region; forming a first channel hole that substantially vertically penetrates a second portion of the first layer stack that overlaps with the chip region; forming a sacrificial layer that fills the first channel hole; forming a second layer stack in which third material layers and fourth material layers are alternately stacked on the first layer stack and the sacrificial layer; forming a second channel hole that substantially vertically penetrates a second portion of the second layer stack that overlaps with the chip region and is connected to the first channel hole together with openings that substantially vertically penetrate a first portion of the second layer stack within the scribe lane region; removing the sacrificial layer through the second channel hole; forming memory layers, channel layers, and fillers on sidewalls of the first and second channel holes; forming crack propagation guides that fill the openings; irradiating portions of the semiconductor substrate that overlaps with the crack propagation guides with a laser to generate cracks in the portions of the semiconductor substrate; and separating semiconductor chips from the semiconductor substrate by propagating the cracks while a crack propagation direction is guided by the crack propagation guides.

According to another embodiment of the present disclosure, there may be provided a method of manufacturing a semiconductor chip including: forming a layer stack in which a first material layer and a second material layer are alternately stacked over a semiconductor substrate that includes a chip region and a scribe lane region; forming a first channel hole that substantially vertically penetrates a second portion of the first layer stack that overlaps with the chip region together with openings that substantially vertically penetrate a first portion of the first layer stack within the scribe lane region; forming sacrificial layers that fill the first channel hole and the openings to form crack propagation guides with portions of the sacrificial layer that fill the openings; forming a second layer stack in which a third material layer and a fourth material layer are alternately stacked on the first layer stack and the sacrificial layers; forming a second channel hole that substantially vertically penetrates a second portion of the second layer stack that overlaps with the chip region and is connected to the first channel hole; removing another portion that fills the first channel hole of the sacrificial layer through the second channel hole; forming memory layers, channel layers, and fillers on sidewalls of the first and second channel holes; irradiating portions of the semiconductor substrate that overlaps with the crack propagation guides with a laser to generate cracks in the portions of the semiconductor substrate; and separating semiconductor chips from the semiconductor substrate by propagating the cracks while a crack propagation direction is guided by the crack propagation guides.

DETAILED DESCRIPTION

Figure 1:
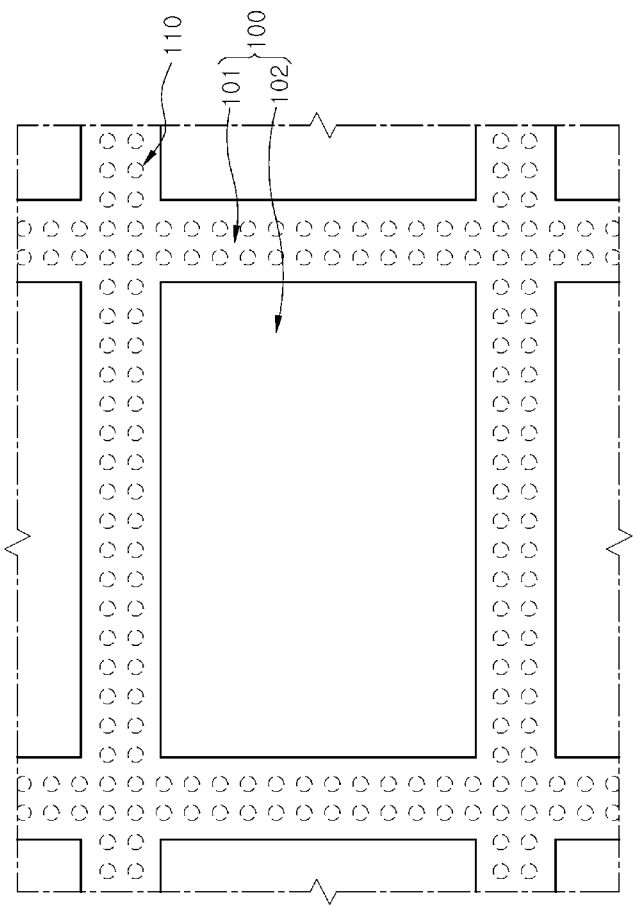
FIG. 1 is a schematic plan view illustrating an arrangement shape of crack propagation guides in a semiconductor substrate according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may refer to a semiconductor package structure in which a structure in which semiconductor substrates are stacked is packaged. The semiconductor substrate may refer to a semiconductor wafer, a semiconductor die, or a semiconductor chip in which electronic components and devices are integrated. The semiconductor chip may refer to a memory chip in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors such as application processors (Aps), graphic processing units (GPUs), central processing units (CPUs) or system-on-chips (SoCs). The semiconductor device may be employed in information communication systems such as mobile phones, electronic systems associated with biotechnology or health care, or wearable electronic systems. The semiconductor device may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a schematic plan view illustrating an arrangement shape of crack propagation guides 110 according to an embodiment of the present disclosure.

Referring to FIG. 1, a method of manufacturing a semiconductor chip according to an embodiment may include a process of cutting a semiconductor substrate 100 and separating the semiconductor substrate 100 into individual semiconductor chips. The semiconductor substrate 100 may include chip regions 102 in which semiconductor devices are integrated and a scribe lane region 101 between the chip regions 102. The chip regions 102 may be regions to be separated into semiconductor chips. The scribe lane region 101 may be a region on which the cutting process or the separation process is to be performed.

The process of separating semiconductor chips that include the chip regions 102 from the semiconductor substrate 100 may include a wafer dicing process. The wafer dicing process may be performed as a process of cutting portions of the scribe lane region 101 with a laser. For example, a stealth dicing process may be used to separate semiconductor chips. A portion of the semiconductor substrate 100, corresponding to the scribe lane region 101, may be irradiated with a laser to generate initial cracks in the semiconductor substrate 100, and the generated cracks may be propagated to separate the semiconductor chips from the semiconductor substrate 100.

The crack propagation guides 110 may be formed within the scribe lane region 101 of the semiconductor substrate 100. The plurality of crack propagation guides 110 may be arranged in a row within the scribe lane region 101 of the semiconductor substrate 100. The crack propagation guides 110 may lead or guide the direction in which the crack propagates when the initial cracks grow and propagate. The crack propagation guides 110 may help or guide the cracks to grow or propagate.

The crack propagation guides 110 may guide the crack propagation direction, so that it is possible to effectively suppress, reduce, or substantially prevent the cracks from propagating in an undesirable direction. If the cracks propagate in the wrong direction, the chip regions 102 may be damaged by the cracks. If the cracks propagate in the wrong direction, the semiconductor substrate 100 may be undivided, and the semiconductor chips might not be separated. The crack propagation guides 110 guide the crack propagation direction, thereby effectively suppressing, reducing, or substantially preventing damage due to cracks or the chip regions 102 being un-segmented.

FIGS. 2 to 13 are schematic cross-sectional views illustrating process steps of a method of manufacturing a semiconductor chip according to an embodiment of the present disclosure.

Figure 2:
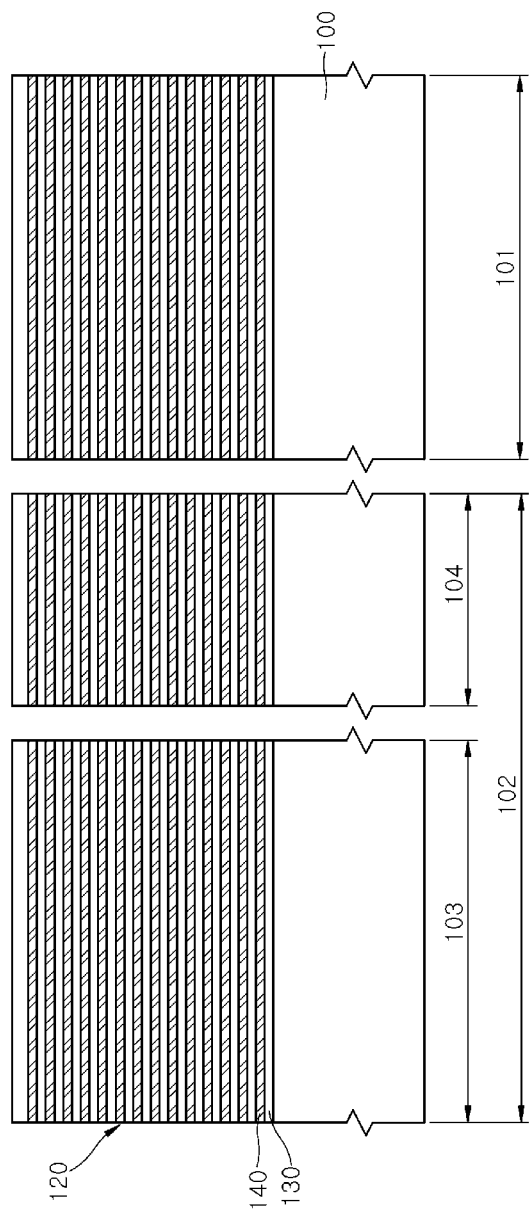
FIGS. 2 to 13 are schematic cross-sectional views illustrating process steps of a method of manufacturing a semiconductor chip according to an embodiment of the present disclosure.

Referring to FIG. 2, a layer stack 120 may be formed on a semiconductor substrate 100. The semiconductor substrate 100 may include a chip region 102 that is surrounded by a scribe lane region 101. The chip region 102 may include a cell region 103 and a contact region 104. The cell region 103 may be a region in which transistors or memory cells are disposed, and the contact region 104 may be a region in which metal contacts are disposed for electrical connection.

The layer stack 120 may be introduced as a structure for forming a semiconductor device that includes a three-dimensional (3D) memory cell structure. The semiconductor device may include a 3D NAND memory device. The semiconductor device may include a nonvolatile memory device. The layer stack 120 may be formed by alternately and repeatedly stacking a first material layer 130 and a second material layer 140. The first material layers 130 or the second material layers 140 may be stacked in tens or hundreds of layers.

The first material layer 130 and the second material layer 140 may include different insulating materials from each other. For example, the first material layer 130 may include silicon oxide (SiO$_2$), and the second material layer 140 may include silicon nitride (Si$_3$N$_4$). Because the first material layers 130 and the second material layers 140 include different insulating materials from each other, it is possible to selectively remove the second material layers 140 in a subsequent process.

A peripheral circuit unit (not illustrated) may be further formed between the semiconductor substrate 100 and the layer stack 120. The peripheral circuit unit may include a peripheral circuit for controlling memory cells to be subsequently formed using the layer stack 120. The peripheral circuit unit may be formed in a peri. under cell (PUC) structure that is positioned below the cell.

Figure 3:
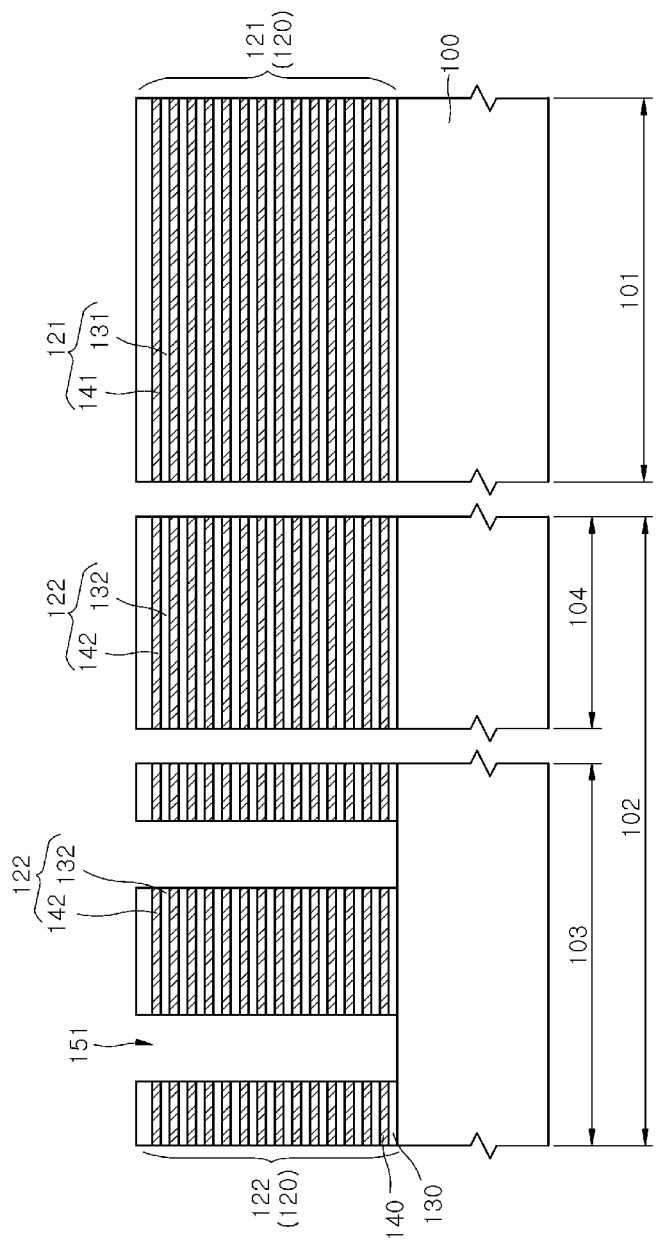

Referring to FIG. 3, channel holes 151 may be formed to substantially vertically penetrate some portions of a second portion 122 of the layer stack 120. The channel holes 151 may vertically penetrate second portions of the first material layers 130 and second portions 142 of the second material layers 140. The channel holes 151 may penetrate the second portions 132 of all the first material layers 130 and the second portions 142 of all the second material layer 140, which belong to the second portion 122 of the layer stack 120. The second portion 122 of the layer stack 120, the second portions 132 of the first material layers 130, and the second portions 142 of the second material layers 140 may be portions that overlap with the chip region 102 of the semiconductor substrate 100. A first portion 121 of the layer stack 120, first portions 131 of the first material layers 130, and first portions 141 of the second material layers 140 may be portions that overlap with the scribe lane region 101 of the semiconductor substrate 100.

Figure 4:
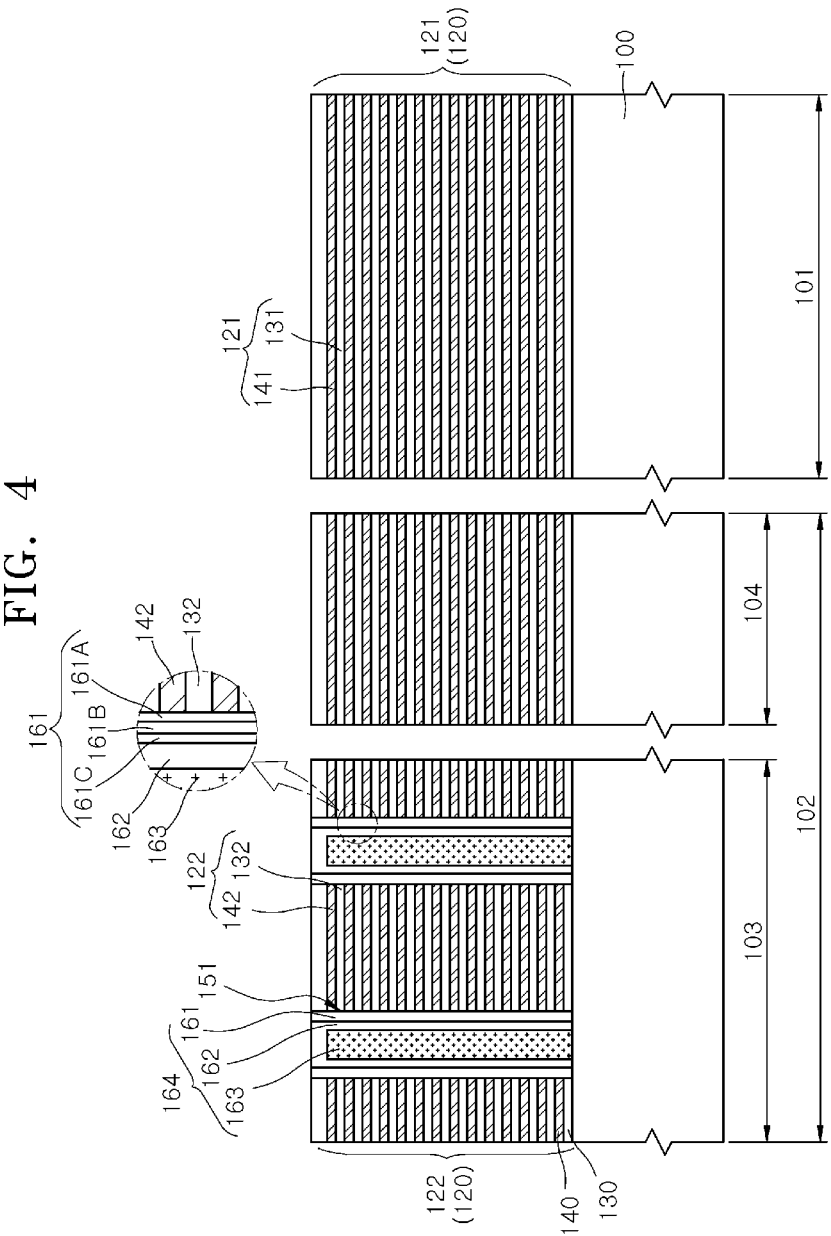

Referring to FIG. 4, vertical channel structures 164 may be formed to fill the channel holes 151. A memory layer 161, a channel layer 162, and a filler 163 may be sequentially formed on a sidewall of each of the channel holes 151. The memory layer 161 may be a layer that traps electric charges to store data. The memory layer 161 may include a tunneling layer 161A through which electric charges tunnel, a charge trap layer 161B in which electric charges are trapped, and a charge blocking layer 161C that blocks electric charge transfer. The tunneling layer 161A may include silicon oxide. The charge trap layer 161B may include silicon nitride. The charge blocking layer 161C may include silicon oxide. The memory layer 161 may be formed of a material that is capable of storing data, such as a phase change material, nano dots, or a ferroelectric material.

The channel layer 162 may include a semiconductor material including silicon (Si). The channel layer 162 and the memory layer 161 may be formed in a thin film that is thinner than the filler 163 so that the channel hole 151 might not be completely filled with only the channel layer 162 and the memory layer 161. The filler 163 may be formed as an additional layer that completely fills the channel hole 151. The filler 163 may include an insulating material.

Figure 5:
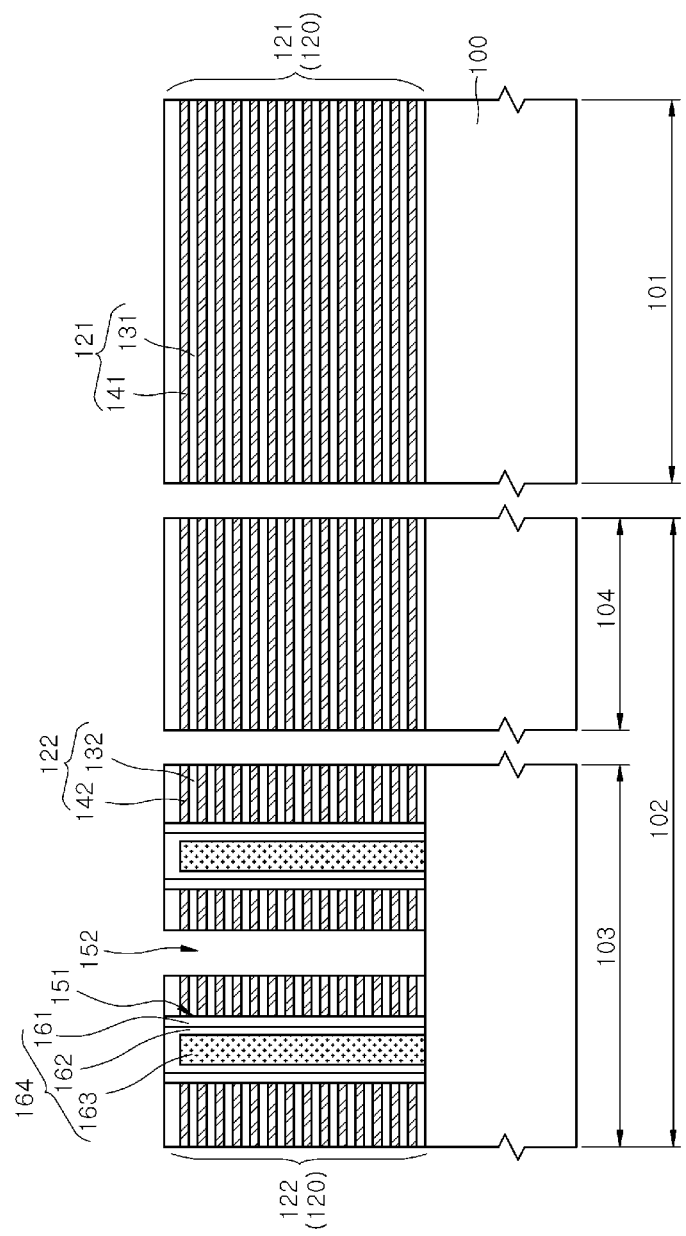

Referring to FIG. 5, slits 152 that substantially vertically penetrate other portions of the second portion 122 of the layer stack 120 may be formed. The slits 152 may substantially vertically penetrate the second portions 132 of the first material layer 130 and the second portions 142 of the second material layer 140. The slits 152 may penetrate the second portions 132 of all the first material layers 130 and the second portions 142 of all the second material layers 140 that belong to the second portion 122 of the layer stack 120. The slits 152 may be disposed between the vertical channel structures 164 to separate some of the vertical channel structures 164 from each other.

Figure 6:
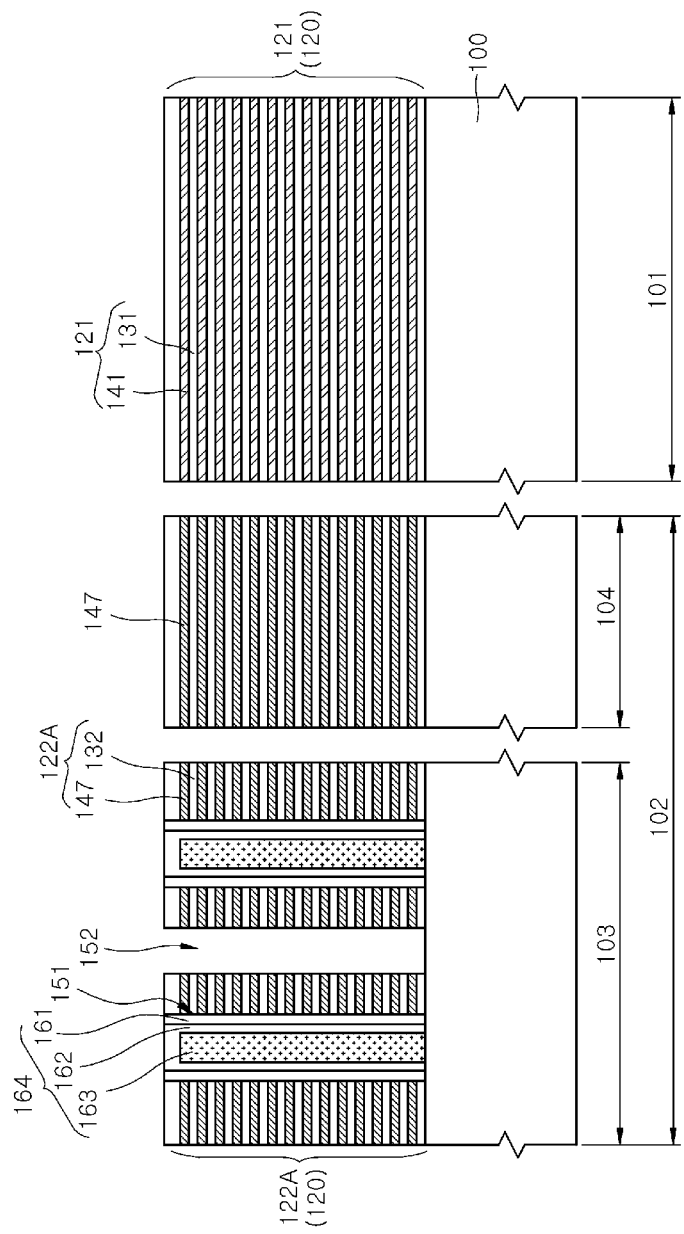

Referring to FIGS. 5 and 6 together, side portions of the second portions 142 of the second material layers 140 that are positioned in the second portion 122 of the layer stack 120 may be exposed to the side surfaces of the slits 152. Some of the second portions 142 of the second material layers 140 may be exposed to the slits 152, and the first portions 141 of the second material layers 140 that are positioned in the first portion 121 of the layer stack 120 might not be exposed to the slits 152. The second portions 142 of the second material layers 140 may be selectively etched and removed through the slits 152. In this case, the first portions 141 of the second material layers 140 may be maintained without being removed.

A conductive material may be deposited through the slits 152 so that the spaces from which the second portions 142 of the second material layers 140 are removed may be filled with conductive layers 147. Each of the conductive layers 147 may include a conductive material such as tungsten (W).

In this way, the second portions 142 of the second material layers 140 that are positioned in the second portion 122 of the layer stack 120 may be replaced with the conductive layers 147 through the slits 152. Accordingly, the second portion 122 of the layer stack 120 may be replaced with the second portion 122A of the layer stack 120 having a structure in which the second portions 132 of the first material layers 130 and the conductive layers 147 are alternately and repeatedly stacked. The first portion 121 of the layer stack 120 may be maintained in a structure in which the first portions 131 of the first material layers 130 and the first portions 141 of the second material layers 140 are repeatedly stacked.

The structure that includes the memory layer 161 and the channel layer 162 of the vertical channel structure 164 and the conductive layer 147 may constitute a memory cell structure. The memory cell structures may constitute a vertically repeated structure or a string structure over the semiconductor substrate 100. The conductive layer 147 may be used as a gate electrode for the channel layer 162. The conductive layers 147 may be used as word lines for the memory cell structures. Some of the conductive layers 147 may be used as source select lines (SSL). Others of the conductive layers 147 may be used as drain select lines (DSL).

Figure 7:
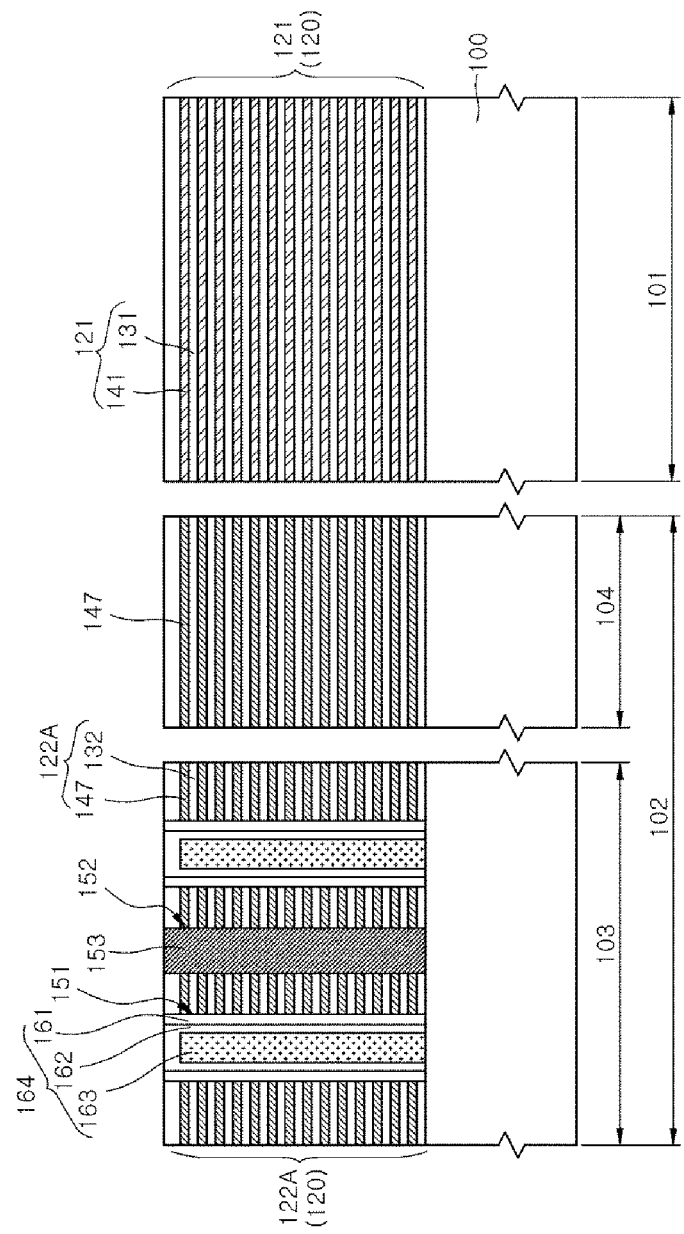

Referring to FIG. 7, slit patterns 153 may be formed to fill the slits 152. The slit pattern 153 may include an insulating material, such as silicon oxide.

Figure 8:
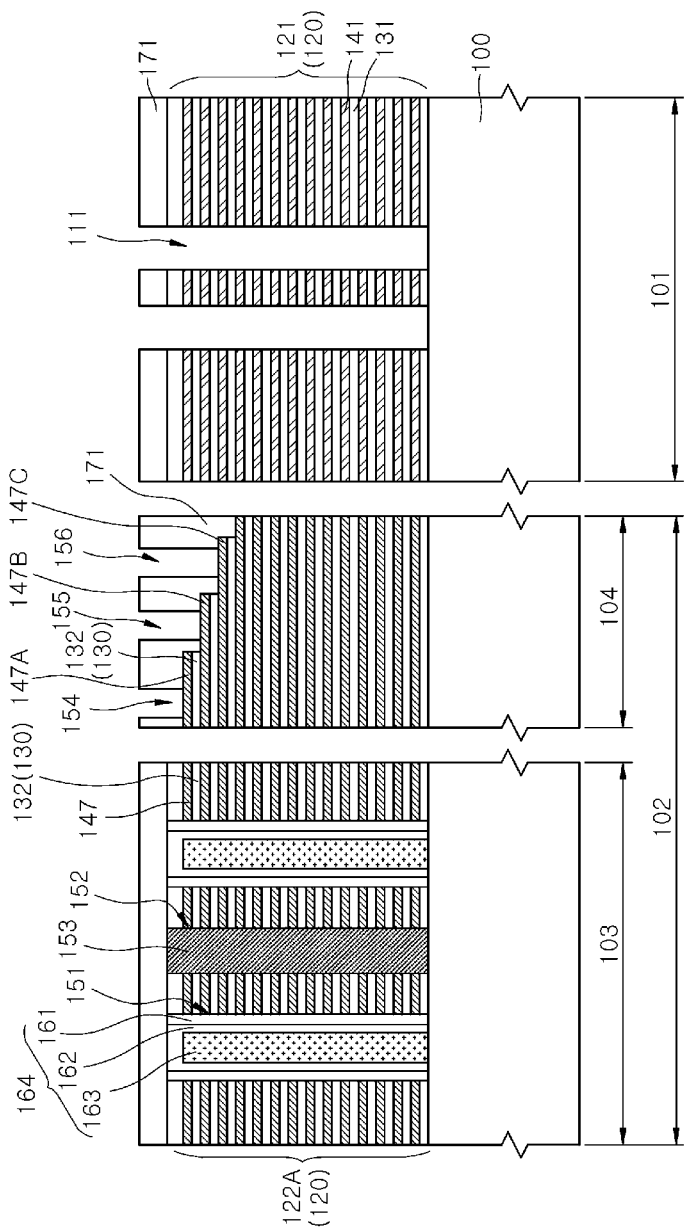

Referring to FIG. 8, contact holes 154, 155, and 156 may be formed in the contact region 104 of the chip region 102 of the semiconductor substrate 100. For example, contact holes including the first contact hole 154, the second contact hole 155, and the third contact hole 156 may be formed. The first contact hole 154, the second contact hole 155, and the third contact hole 156 may have different depths from each other. The first contact hole 154 may be formed to have a shallower depth than the second contact hole 154 and the third contact hole 156.

More specifically, some portions of the conductive layers 147 that are positioned to overlap with the contact region 104 of the chip region 102 of the semiconductor substrate 100 may be removed to form a step shape. Some portions of the conductive layers 147 may be sequentially removed so that the upper first conductive layer 147A may expose a portion of the second conductive layer 147B that is positioned below. The second conductive layer 147B may expose a portion of the third conductive layer 147C that is positioned below. Some portions of the conductive layers 147 may be removed to form a stair shape like the first, second, and third conductive layers 147A, 147B, and 147C. Accordingly, a stair structure in which end portions of all conductive layers 147 are sequentially exposed may be formed.

In this way, after the conductive layers 147 form the step structure, a first insulating layer 171 covering the step structure and the layer stack 120 may be formed. Thereafter, the first, second, and third contact holes 154, 155, and 156 that expose some portions of the conductive layers 147 may be formed while passing through the first insulating layer 171. Although not illustrated, in the process of forming the first, second, and third contact holes 154, 155, and 156, additional contact holes, having a shallow depth that is different from the depth of the first, second, and third contact holes 154, 155, and 156, may be formed together with the first, second, and third contact holes 154, 155, and 156. The contact holes 154, 155, and 156 may be formed to be connected to the conductive layers 147. For example, the first contact hole 154 may be formed to expose a portion of the end of the first conductive layer 147A, the second contact hole 155 may be formed to expose a portion of the end of the second conductive layer 147B, and the third contact hole 156 may be formed to expose a portion of the end of the third conductive layer 147C.

In the process of forming the contact holes 154, 155, and 156, openings 111 may be formed together with the contact holes 154, 155, and 156. The openings 111 may substantially vertically penetrate the first portions 121 of the layer stack 120 that are positioned within the scribe lane region 101.

Figure 9:
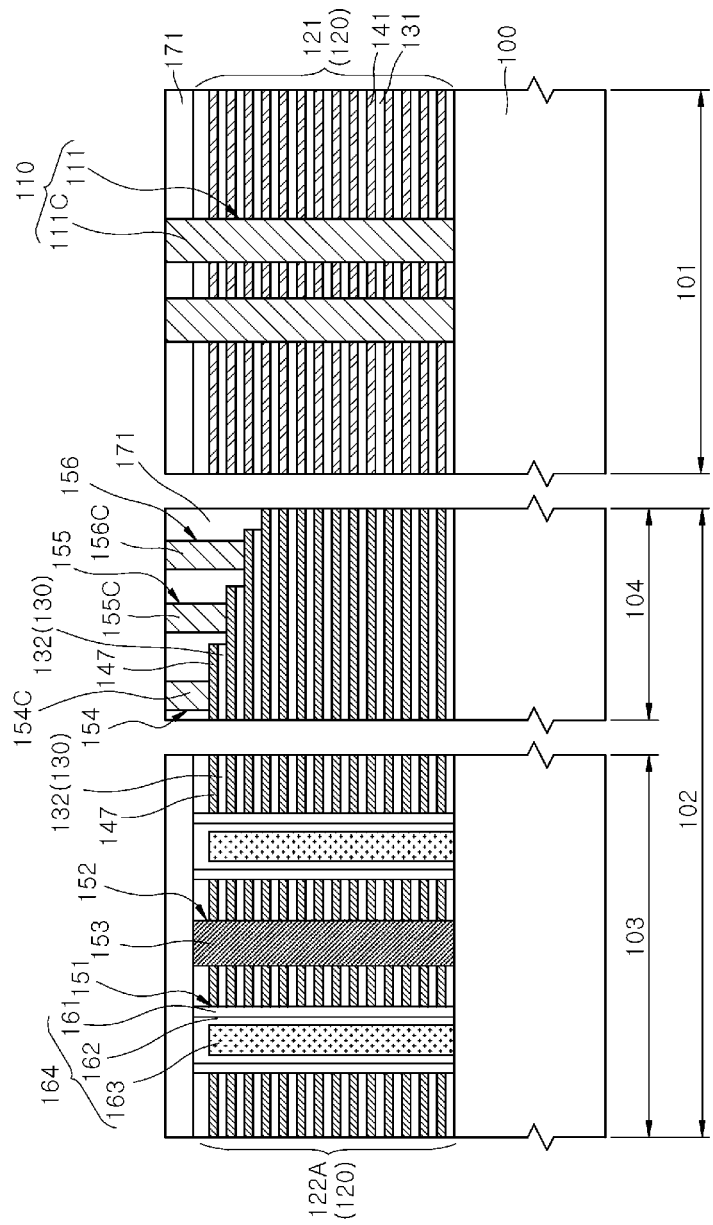

Referring to FIG. 9, the contact holes 154, 155, and 156 may be filled with a conductive material to form conductive contacts 154C, 155C, and 156C in the contact holes 154, 155, and 156. The conductive contacts 154C, 155C, 156C may be formed as metal contacts for electrical connection. Each of the conductive contacts 154C, 155C, and 156C may include a conductive material such as tungsten (W).

In the process of forming the conductive contacts 154C, 155C, and 156C, the contact holes 154, 155, and 156 may be filled with the conductive material, and the openings 111 may also be filled with the conductive material. Accordingly, conductive plugs 111C that fill the openings 111 may be formed. The conductive plugs 111C may be formed together in the process of forming the conductive contacts 154C, 155C, and 156C.

A structure including the conductive plug 111C and the opening 111 may constitute a crack propagation guide 110. In a process of forming the conductive contacts 154C, 155C, and 156C and the contact holes 154, 155, and 156 in the chip region 102, the conductive plugs 111C and the openings 111 or the crack propagation guides 110 may be formed together with the conductive contacts 154C, 155C, and 156C and the contact holes 154, 155, and 156. Accordingly, an additional process step for forming the crack propagation guides 110 within the scribe lane region 101 might not be required. Accordingly, it is possible to form the crack propagation guides 110 within the scribe lane region 101 of the semiconductor substrate 100 without increasing the number of process steps for manufacturing the entire semiconductor device.

Figure 10:
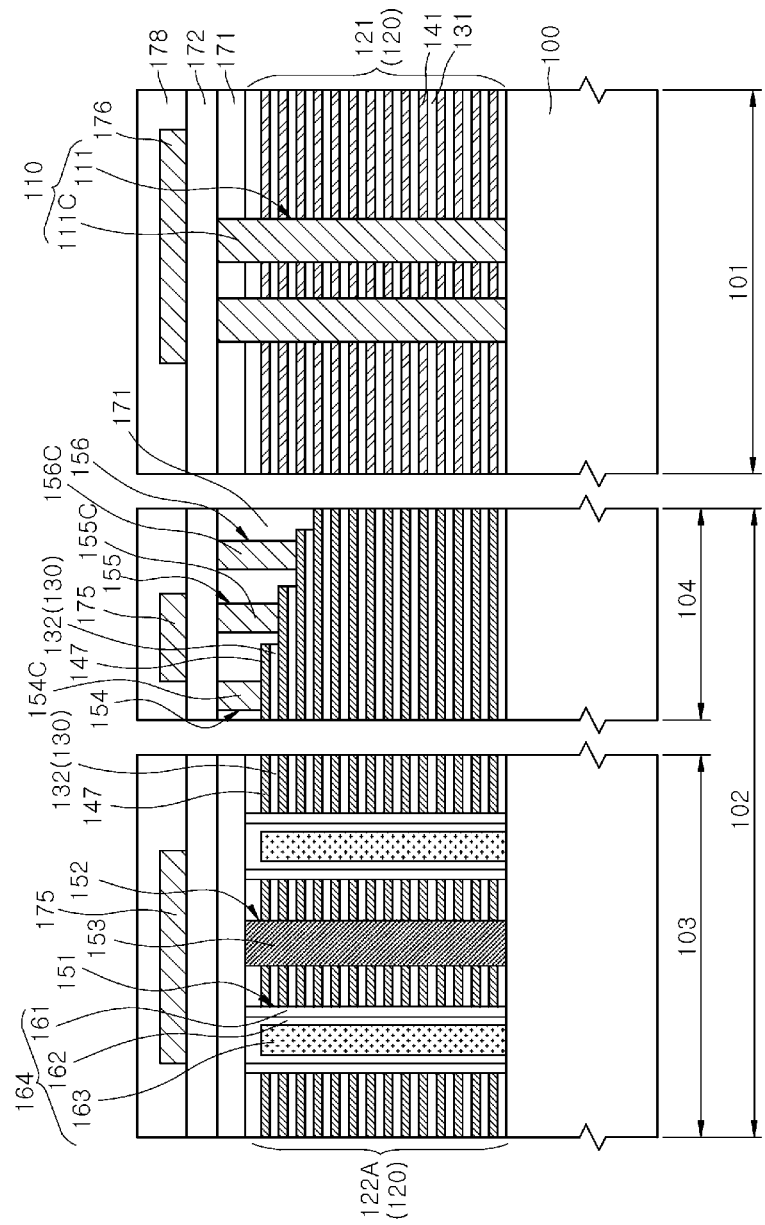

Referring to FIG. 10, conductive patterns 175, used as wirings, may be formed. A second insulating layer 172 may be formed as an interlayer insulating layer on the first insulating layer 171. The conductive patterns 175, used as wirings, may be formed on the second insulating layer 172. The conductive pattern 175 may be formed in a metal layer including aluminum (Al) or copper (Cu). The conductive patterns 175 may be positioned to overlap with the chip region 102 of the semiconductor substrate 100. In a process of forming the conductive patterns 175, a test pattern 176 may be formed over the scribe lane region 101 of the semiconductor substrate 100 together with the conductive patterns 175. The test pattern 176 may be positioned to partially overlap with the crack propagation guides 110.

A third insulating layer 178 that covers the conductive patterns 175 and the test pattern 176 may be further formed. The third insulating layer 178 may be formed as a passivation layer. The passivation layer may include a polymeric layer.

Figure 11:
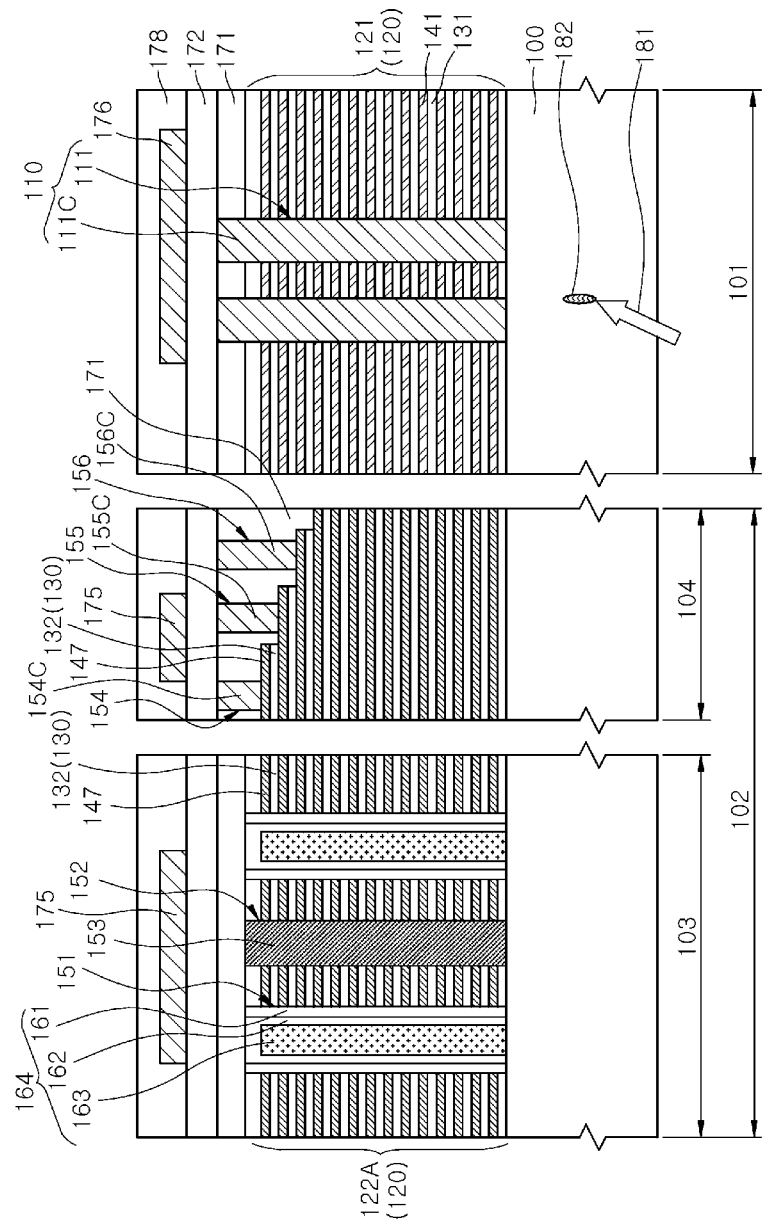
Figure 12:
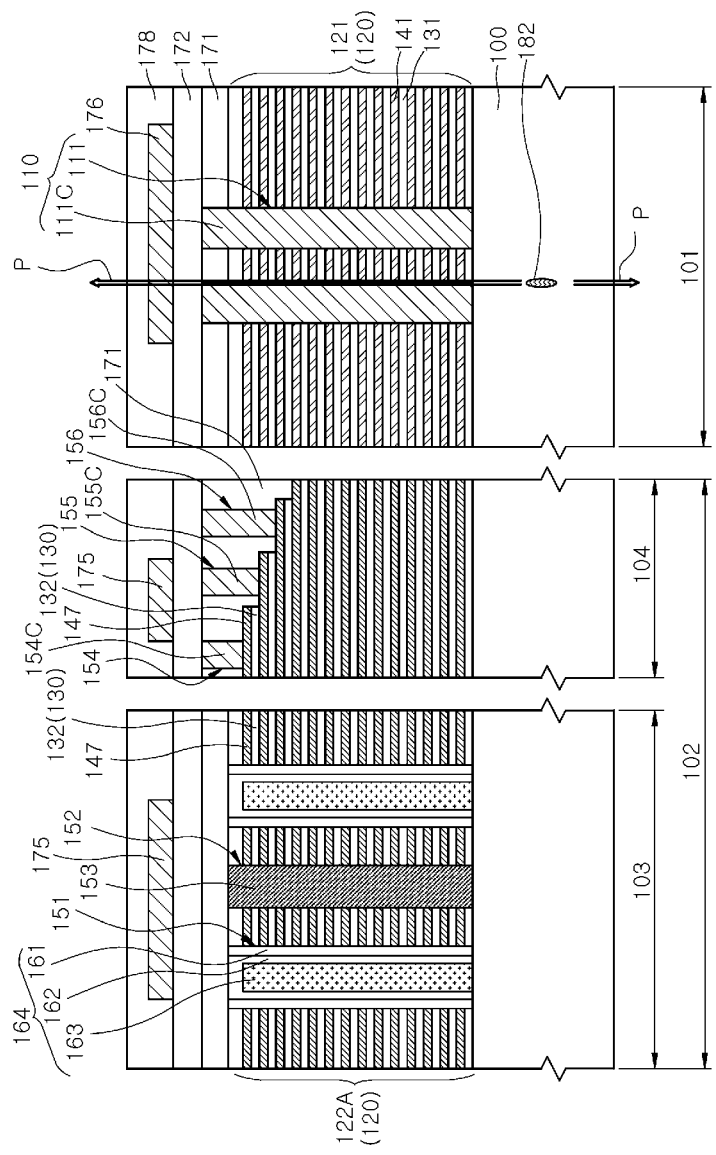
Figure 13:
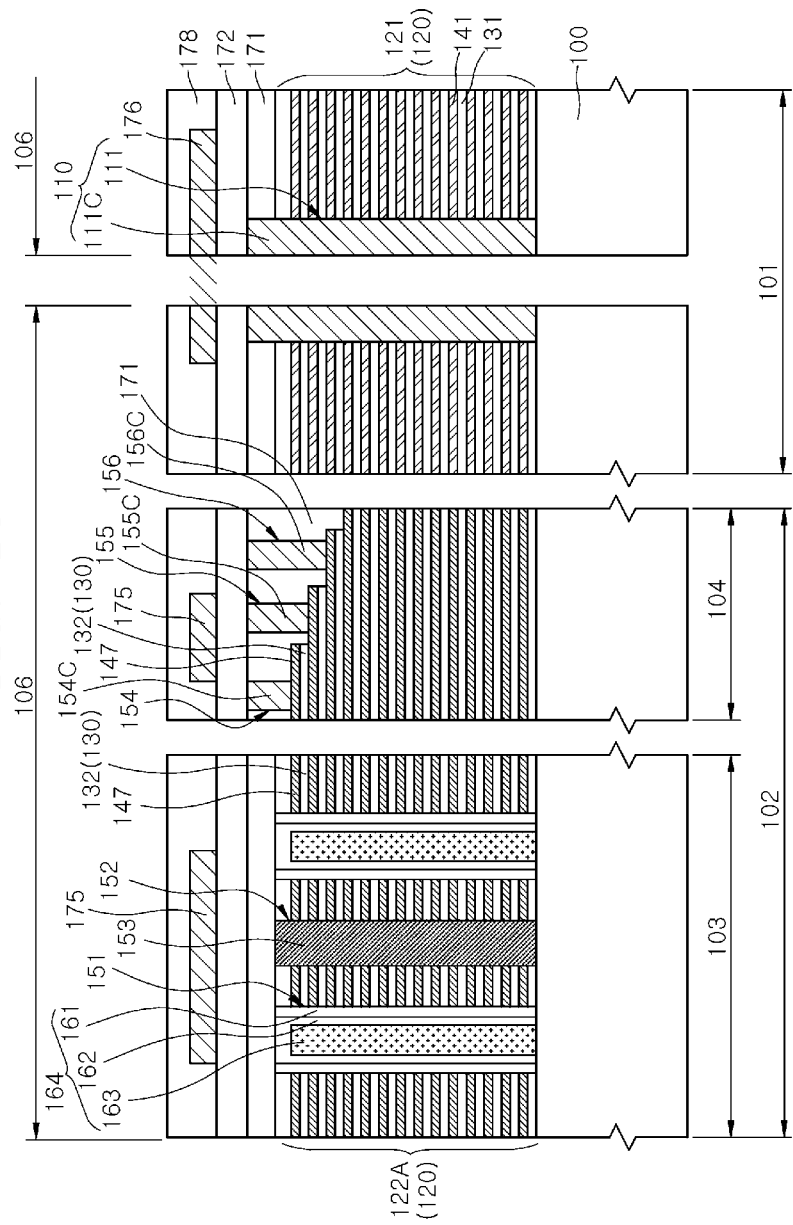

Referring to FIGS. 11 to 13, a process of separating semiconductor chips from the semiconductor substrate 100 may be performed.

Referring to FIG. 11, initial cracks 182 may be generated by irradiating some portions of the semiconductor substrate 100 within the scribe lane region 101 with a laser 181. The portions of the semiconductor substrate 100 in which the cracks 182 are generated may overlap with the crack propagation guides 110. The process of irradiating with the laser 181 may be performed through a stealth dicing process.

Referring to FIG. 12, the cracks 182 may be propagated in a direction substantially perpendicular to the semiconductor substrate 100. The cracks 182 may grow and propagate in a direction substantially perpendicular to the semiconductor substrate 100 by expanding the semiconductor substrate 100 in both lateral directions. The crack propagation direction P in which the cracks 182 propagate may be guided by the crack propagation guides 110. The crack propagation direction P in which the cracks 182 propagate by the crack propagation guides 110 may be induced in a certain direction substantially perpendicular to the semiconductor substrate 100. The cracks 182 may grow and propagate along the crack propagation guides 110. The cracks 182 may propagate along interfaces between the crack propagation guides 110 and the layer stack 120. Alternatively, the cracks 182 may propagate while dividing the crack propagation guides 110 in a vertical direction.

The interface between the first portion 131 of the first material layer 130 of the layer stack 120 and the first portion 141 of the second material layer 140 may act as a factor that prevents the cracks 182 from propagating in the vertical direction. Accordingly, the cracks 182 may be blocked at the interfaces between the first portions 131 of the first material layers 130 of the layer stack 120 and the first portions 141 of the second material layers 140 so that the cracks 182 may progress and propagate along the interfaces. However, the crack propagation guides 110 may provide paths through which the cracks 182 may preferentially propagate based on the crack propagation guides 110 that penetrate the layer stack 120. Accordingly, the cracks 182 may preferentially propagate along the interfaces between the crack propagation guides 110 and the layer stack 120 rather than proceeding along the interfaces between the first portions 131 of the first material layers 130 and the first portions 141 of the second material layers 140 of the layer stack 120. The cracks 182 do not penetrate the layer stack 120 so that a defect in which the semiconductor substrate 100 and the layer stack 120 are not divided may be effectively prevented or reduced.

Referring to FIGS. 12 and 13, as the cracks 182 propagate to completely penetrate the semiconductor substrate 100 and the layer stack 120, the semiconductor substrate 100 may be separated into a plurality of semiconductor chips 106.

Figure 14:
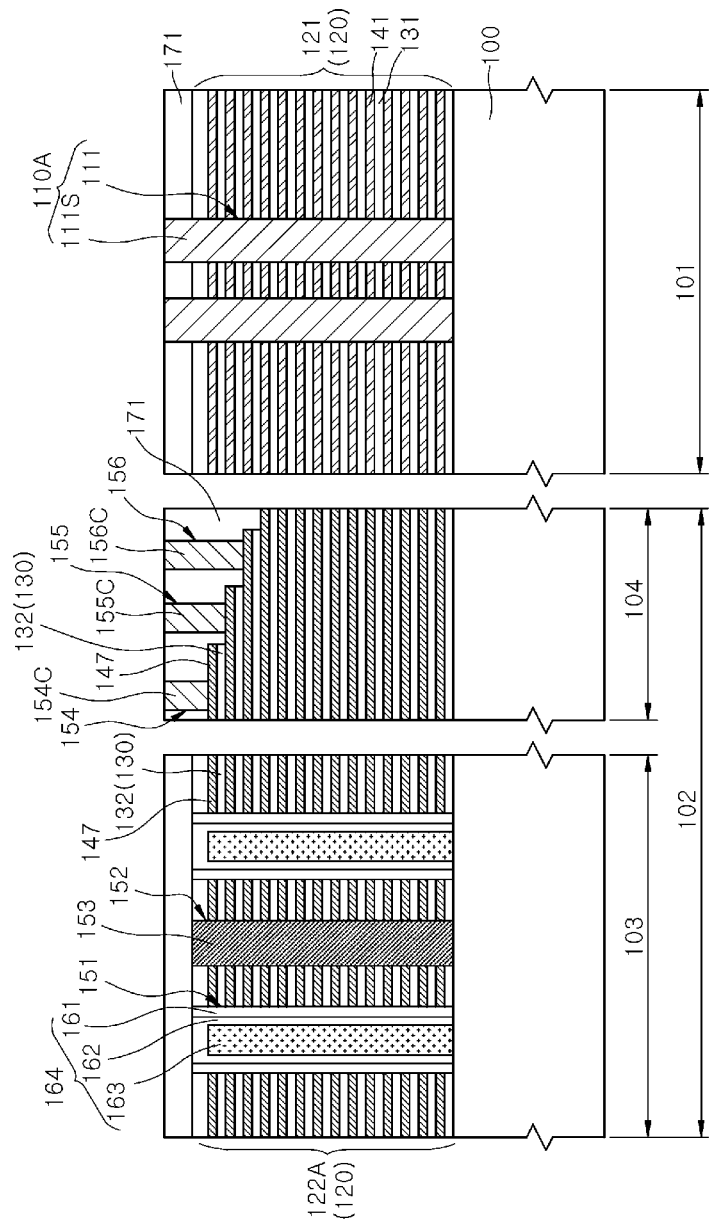
FIGS. 14 to 16 are schematic cross-sectional views illustrating process steps of a method of manufacturing a semiconductor chip according to another embodiment of the present disclosure.
Figure 15:
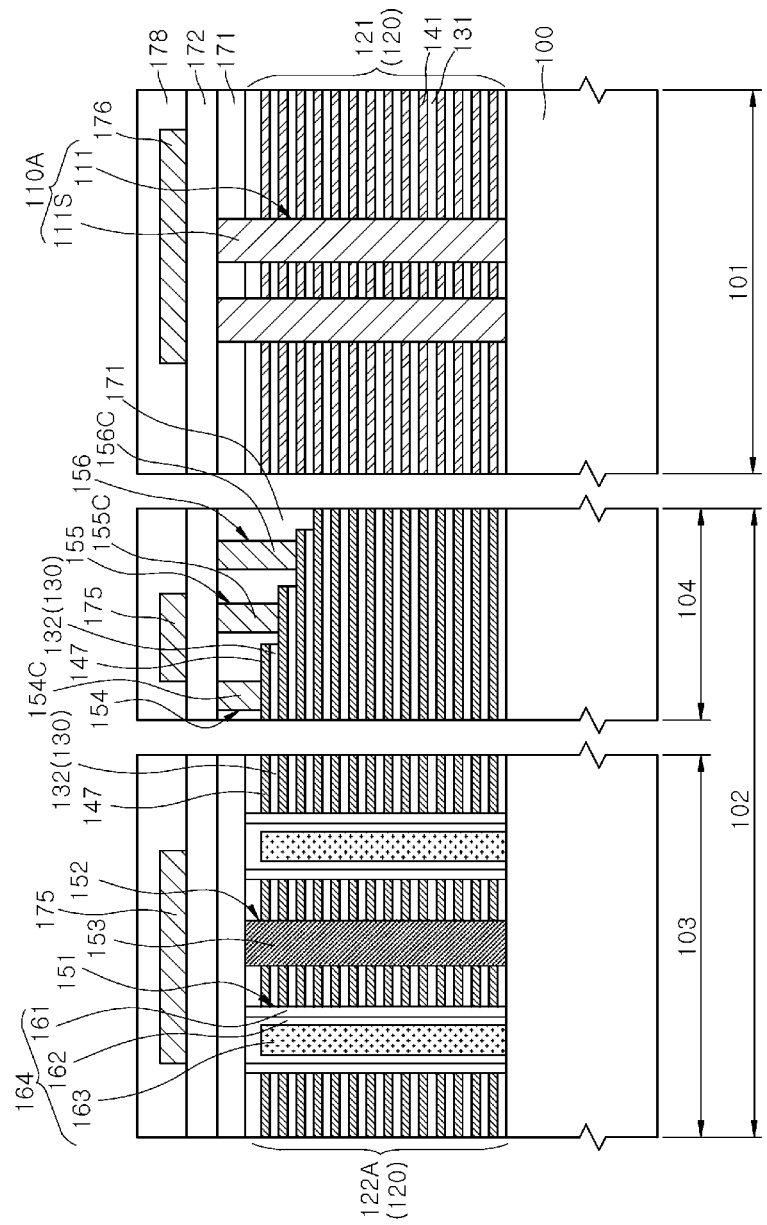
Figure 16:
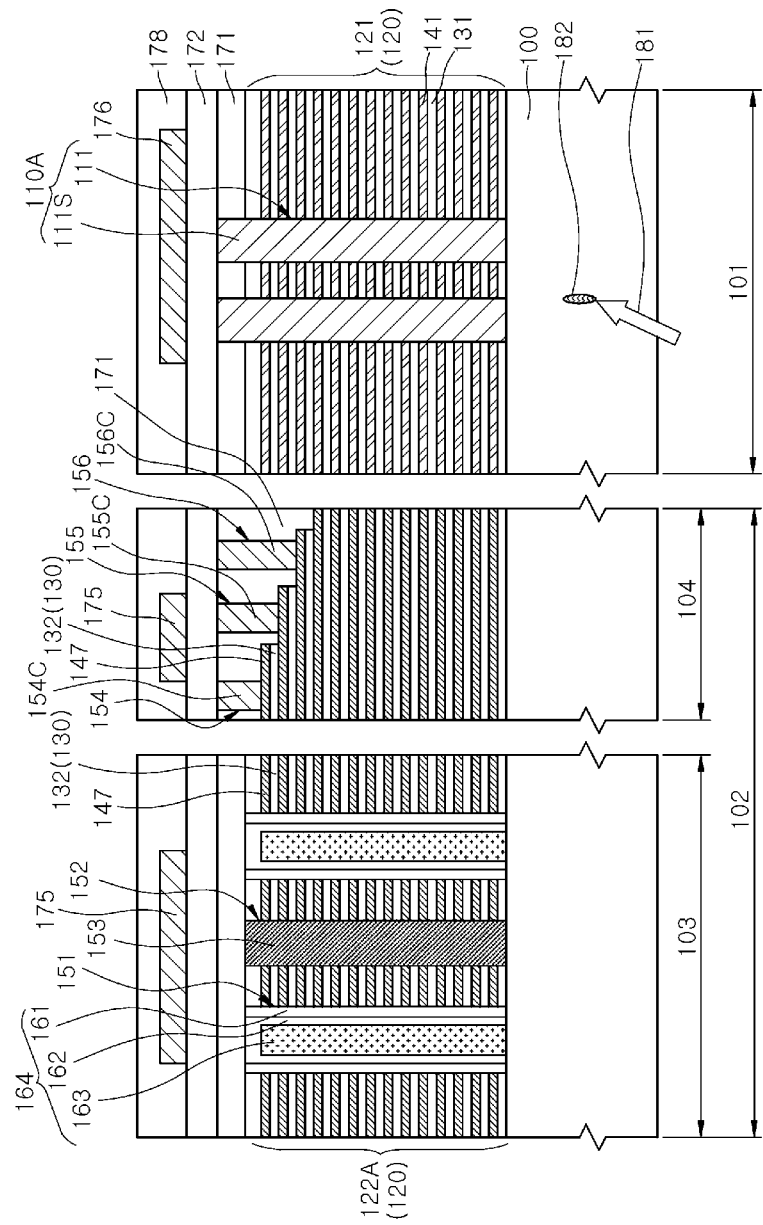

FIGS. 14 to 16 are schematic cross-sectional views illustrating process steps of a method of manufacturing a semiconductor chip according to another embodiment of the present disclosure.

Referring to FIG. 14 together with FIG. 8, contact holes 154, 155, and 156 and openings 111 may be formed. Referring to FIG. 14, the contact holes 154, 155, and 156 may be filled with a conductive material to form conductive contacts 154C, 155C, and 156C in the contact holes 154, 155, and 156. The conductive contacts 154C, 155C, 156C may be formed as metal contacts for electrical connection. Each of the conductive contacts 154C, 155C, and 156C may include a conductive material such as tungsten (W).

Openings 111 may be filled with an insulating material to form insulating plugs 111S that fill the openings 111. The structure including the insulating plugs 111S and the openings 111 may constitute crack propagation guides 110A.

Referring to FIG. 15, a second insulating layer 172 may be formed as an interlayer insulating layer on a first insulating layer 171. Conductive patterns 175, used as wirings, may be formed on the second insulating layer 172. In the process of forming the conductive patterns 175, a test pattern 176 may be formed over the scribe-brain region 101 of the semiconductor substrate 100 together with the conductive patterns 175. The test pattern 176 may be positioned to partially overlap with the crack propagation guides 110A. A third insulating layer 178 that covers the conductive patterns 175 and the test pattern 176 may be further formed.

Referring to FIG. 16, initial cracks 182 may be generated by irradiating portions of the scribe lane region 101 of the semiconductor substrate 100 with a laser 181. The portion of the semiconductor substrate 100 in which the cracks 182 are generated may overlap with the crack propagation guides 110A. The cracks 182 may propagate in a direction substantially perpendicular to the semiconductor substrate 100 to separate the semiconductor substrate 100 into a plurality of semiconductor chips.

Figure 17:
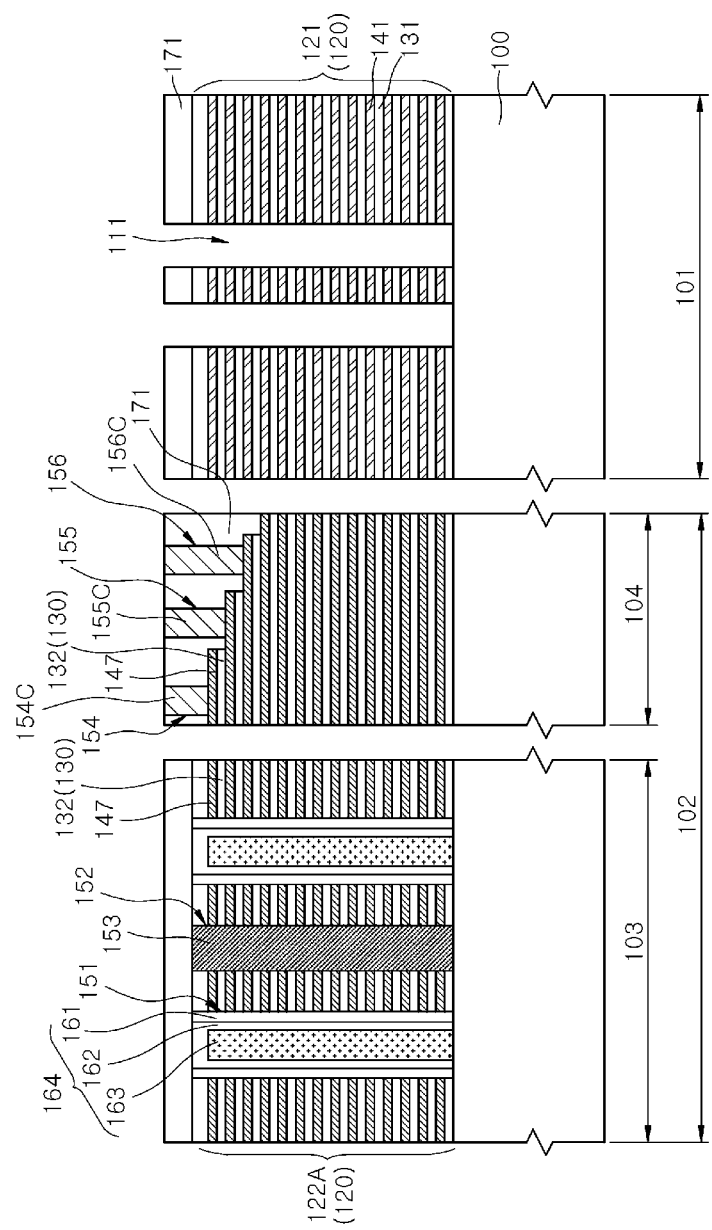
FIGS. 17 and 18 are schematic cross-sectional views illustrating process steps of a method of manufacturing a semiconductor chip according to another embodiment of the present disclosure.
Figure 18:
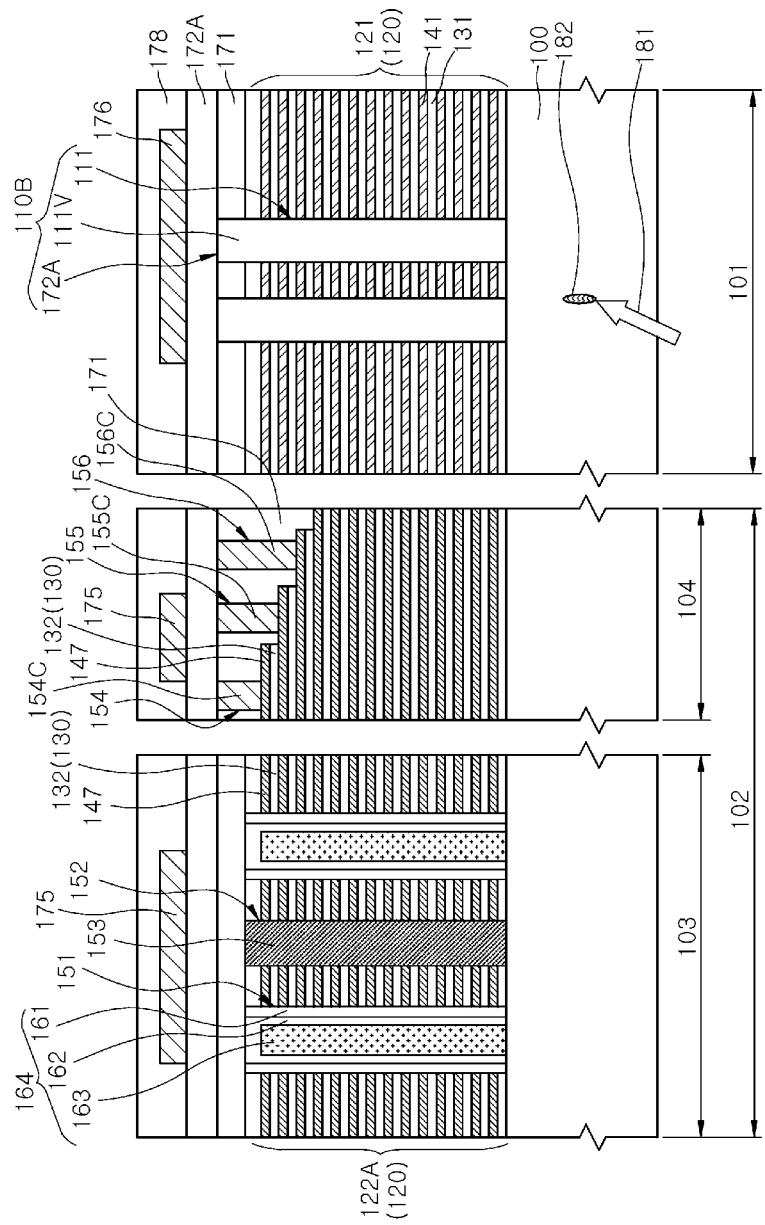

FIGS. 17 and 18 are schematic cross-sectional views illustrating process steps of a method of manufacturing a semiconductor chip according to another embodiment of the present disclosure.

Referring to FIG. 17 together with FIG. 8, contact holes 154, 155, and 156 and openings 111 may be formed. Referring to FIG. 17, the contact holes 154, 155, and 156 may be filled with a conductive material to form conductive contacts 154C, 155C, and 156C in the contact holes 154, 155, and 156. The conductive contacts 154C, 155C, and 156C may be formed as metal contacts. Each of the conductive contacts 154C, 155C, and 156C may include a conductive material such as tungsten (W).

Referring to FIG. 18, a second insulating layer 172A may be formed on a first insulating layer 171 as an interlayer insulating layer. The second insulating layer 172A may be formed to close inlets of the openings 111 to form voids 111V in the openings 111. The second insulating layer 172A may include silicon oxide. Partial portions 172AC of the second insulating layer 172A that provide the void 111V and the openings 111 may constitute crack propagation guides 110B.

Conductive patterns 175, used as wirings, may be formed on the second insulating layer 172A. In the process step of forming the conductive patterns 175, a test pattern 176 may be formed over the scribe lane region 101 of the semiconductor substrate 100 along with the conductive patterns 175. A third insulating layer 178 that covers the conductive patterns 175 and the test pattern 176 may be further formed.

Initial cracks 182 may be generated by irradiating portions of the scribe lane region 101 of the semiconductor substrate 100 with a laser 181. The portions of the semiconductor substrate 100 in which the cracks 182 are generated may overlap with the crack propagation guides 110B. The cracks 182 may propagate in a direction substantially perpendicular to the semiconductor substrate 100 to separate the semiconductor substrate 100 into a plurality of semiconductor chips.

FIGS. 19 to 29 are schematic cross-sectional views illustrating process steps of a method of manufacturing a semiconductor chip according to another embodiment of the present disclosure.

Figure 19:
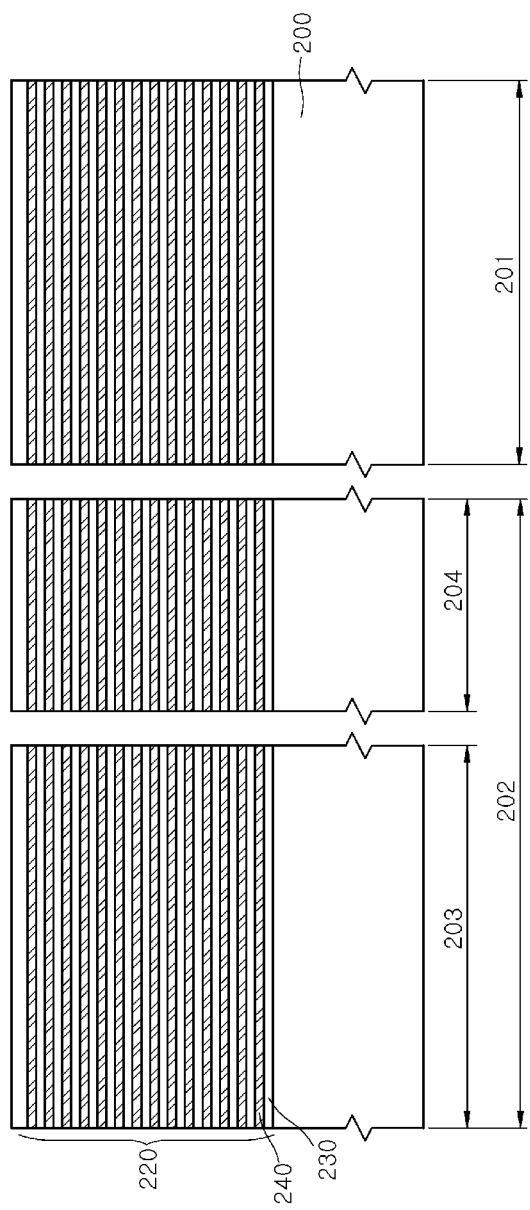
FIGS. 19 to 28 are schematic cross-sectional views illustrating process steps of a method of manufacturing a semiconductor chip according to another embodiment of the present disclosure.

Referring to FIG. 19, a layer stack 220 may be formed on a semiconductor substrate 200. The semiconductor substrate 200 may include a chip region 202 that is surrounded by a scribe lane region 201. The chip region 202 may include a cell region 203 and a contact region 204. The layer stack 220 may be formed by alternately and repeatedly stacking a first material layer 230 and a second material layer 240. The first material layers 230 or the second material layers may be stacked in tens or hundreds of layers. Each of the first material layers 230 may include silicon oxide ($SiO_2$), and each of the second material layers 240 may include silicon nitride ($Si_3N_4$).

Figure 20:
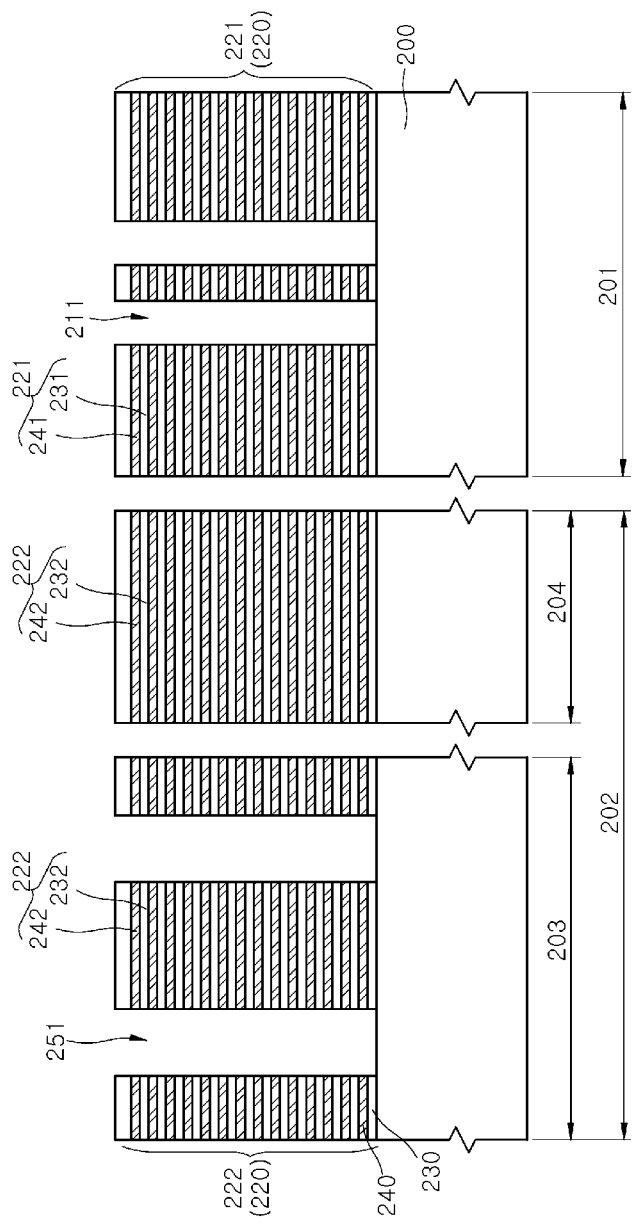

Referring to FIG. 20, channel holes 251 may be formed to substantially vertically penetrate some portions of a second portion 222 of the layer stack 220. The channel holes 251 may substantially vertically penetrate second portions 232 of the first material layers 230 and second portions 242 of the second material layers 242. The channel holes 251 may penetrate the second portions 232 of all the first material layers 230 and the second portions 242 of all the second material layers 240 belonging to the second portions 222 of the layer stack 220. The second portions 222 of the layer stack 220, the second portions 232 of the first material layers 230, the second portions 242 of the second material layers 240, and the channel holes 251 may overlap with the chip region 202 of the semiconductor substrate 200.

While forming the channel holes 251, openings 211 may be formed over the scribe lane region 201 together with the channel holes 251. The openings 211 may be formed to substantially penetrate a first portion 221 of the layer stack 220, first portions 231 of the first material layers 230, and first portions 241 of the second material layers 240. The openings 211, the first portions 221 of the layer stack 220, the first portions 231 of the first material layers 230, and the first portions 241 of the second material layers 240 may overlap with the scribe lane region 201 of the semiconductor substrate 200. Because the openings are formed in the process of forming the channel holes 251 together with the channel holes 251, an additional process step for forming the openings 211 may be omitted.

Figure 21:
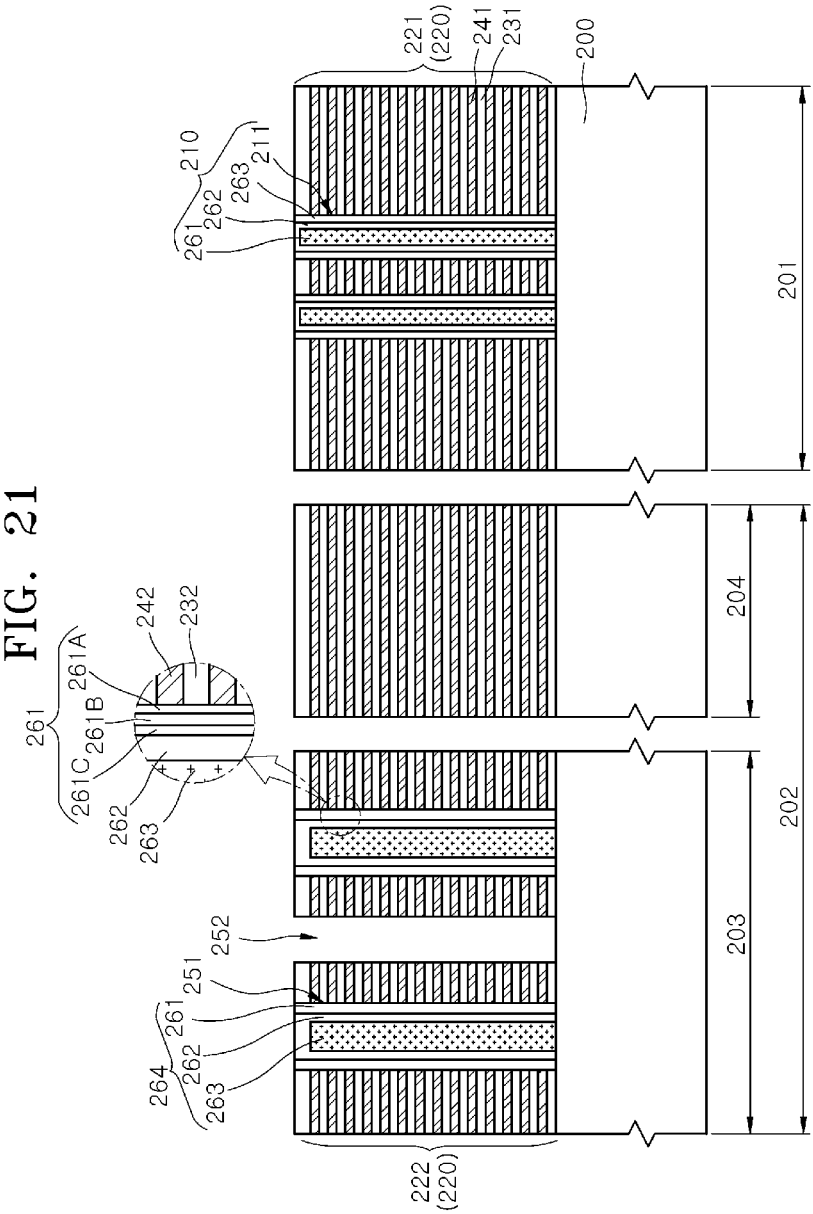

Referring to FIG. 21, vertical channel structures 264 may be formed to fill the channel holes 251. A memory layer 261, a channel layer 262, and a filler 263 may be sequentially formed on a sidewall of each of the channel holes 251. The memory layer 261 may be a layer in which electric charges are trapped and stored. The memory layer 261 may include a tunneling layer 261A, a charge trap layer 261B, and a charge blocking layer 261C. The channel layer 262 may include a semiconductor material, such as silicon (Si). The filler 263 may be formed as a layer that fills the channel hole 251. The filler 263 may include an insulating material.

As the memory layer 261, the channel layer 262, and the filler 263 are sequentially formed on the sidewall of each of the channel holes 251, the memory layer 261, the channel layer 262, and the filler 263 may also be sequentially formed on the sidewall of each of the openings 211. The memory layers 261, the channel layers 262, and the fillers 263 which fill the openings 211 may constitute crack propagation guides 210 along with the openings 211. As such, the crack propagation guides 210 may be formed together in the process step of forming the channel holes 251 and the vertical channel structures 264.

Figure 22:
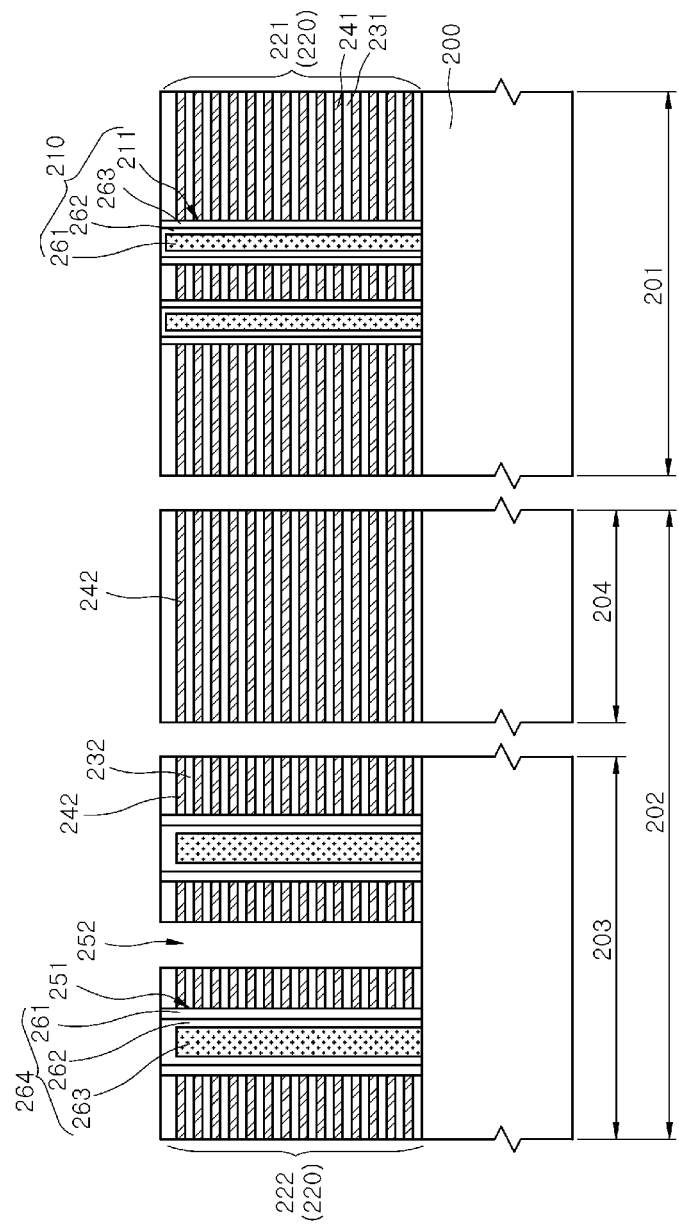

Referring to FIG. 22, slits 252 may be formed to substantially vertically penetrate other portions of the second portion 222 of the layer stack 220.

Figure 23:
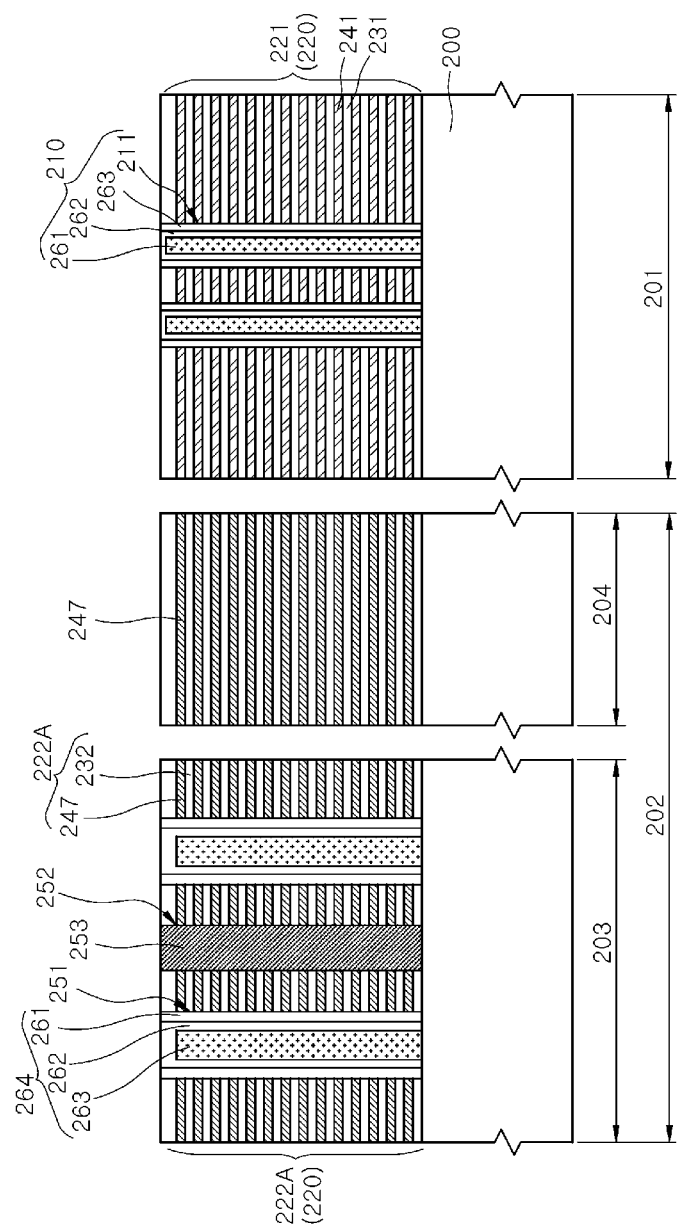

Referring to FIG. 23 together with FIG. 22, the second portions 242 of the second material layers 240 may be selectively etched and removed through the slits 252. A conductive material may be deposited through the slits 252 to form conductive layers 247 that fill the spaces from which the second portions 242 of the second material layers 240 are removed. In this way, the second portions 242 of the second material layers 240 that are positioned in the second portion 222 of the layer stack 220 may be replaced with the conductive layers 247 through the slits 252. Accordingly, the second portion 222 of the layer stack 220 that overlaps with the chip region 202 may be replaced with a second portion 222A having a structure in which the second portions 232 of the first material layers 230 and the conductive layers 247 are alternately stacked. Slit patterns 253 that fill the slits 252 may be formed.

Figure 24:
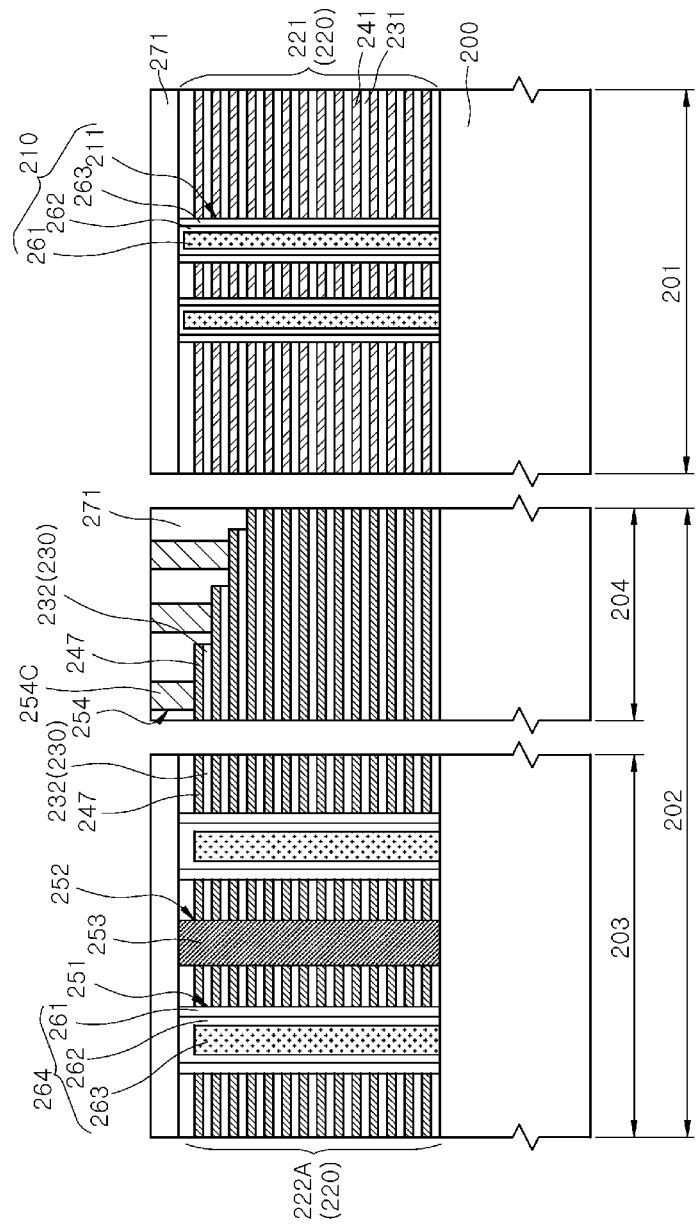

Referring to FIG. 24, contact holes 254 may be formed in the contact region 204 of the chip region 202 of the semiconductor substrate 200. A first insulating layer 271 may be formed on the layer stack 220, and contact holes 254 that penetrate the first insulating layer 271 may be formed. The contact holes 254 may be respectively connected to all portions of the conductive layer 247 that overlaps with the contact region 204 of the chip region 202 of the semiconductor substrate 200. The contact holes 254 may be filled with a conductive material so that conductive contacts 254C may be formed in the contact holes 254.

Figure 25:
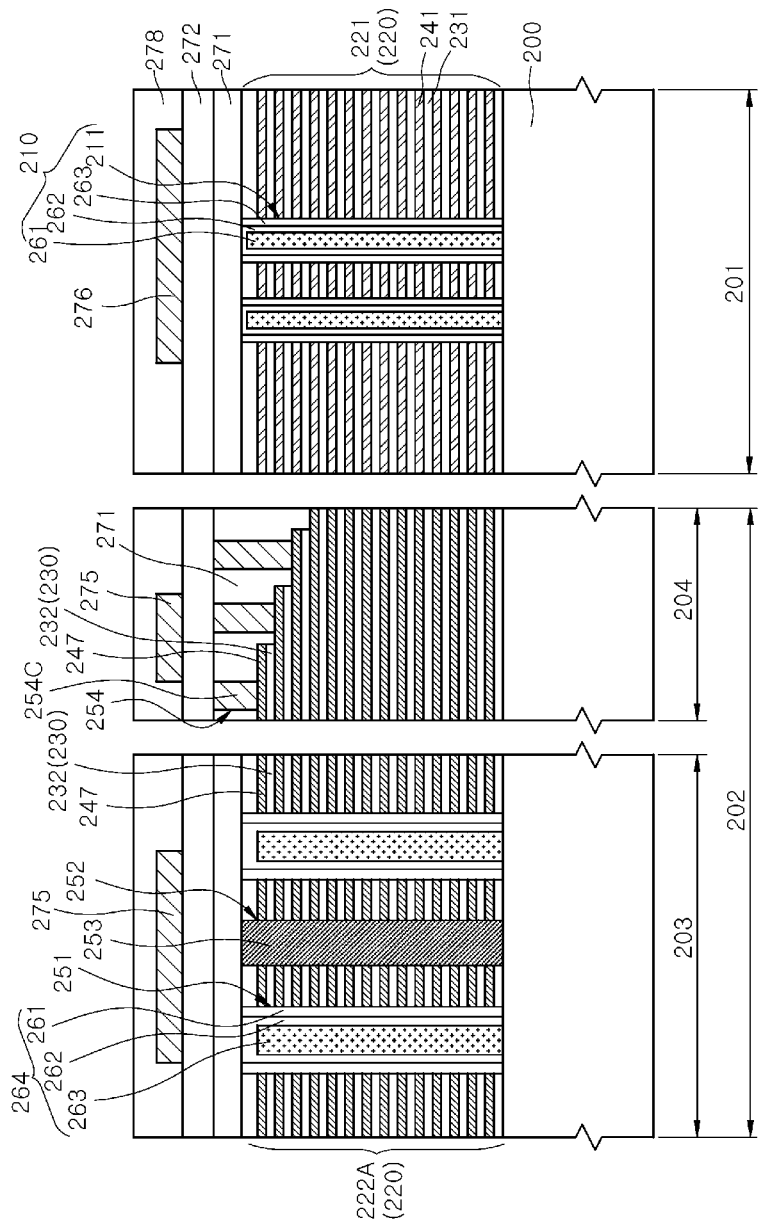

Referring to FIG. 25, a second insulating layer 272 may be formed on the first insulating layer 271 as an interlayer insulating layer. Conductive patterns 275, used as wirings, may be formed on the second insulating layer 272. In a process of forming the conductive patterns 275, a test pattern 276 may also be formed over the scribe lane region 201 of the semiconductor substrate 200 along with the conductive patterns 275. The test pattern 276 may be positioned to partially overlap with the crack propagation guides 210. A third insulating layer 278 that covers the conductive patterns 275 and the test pattern 276 may further be formed.

Figure 26:
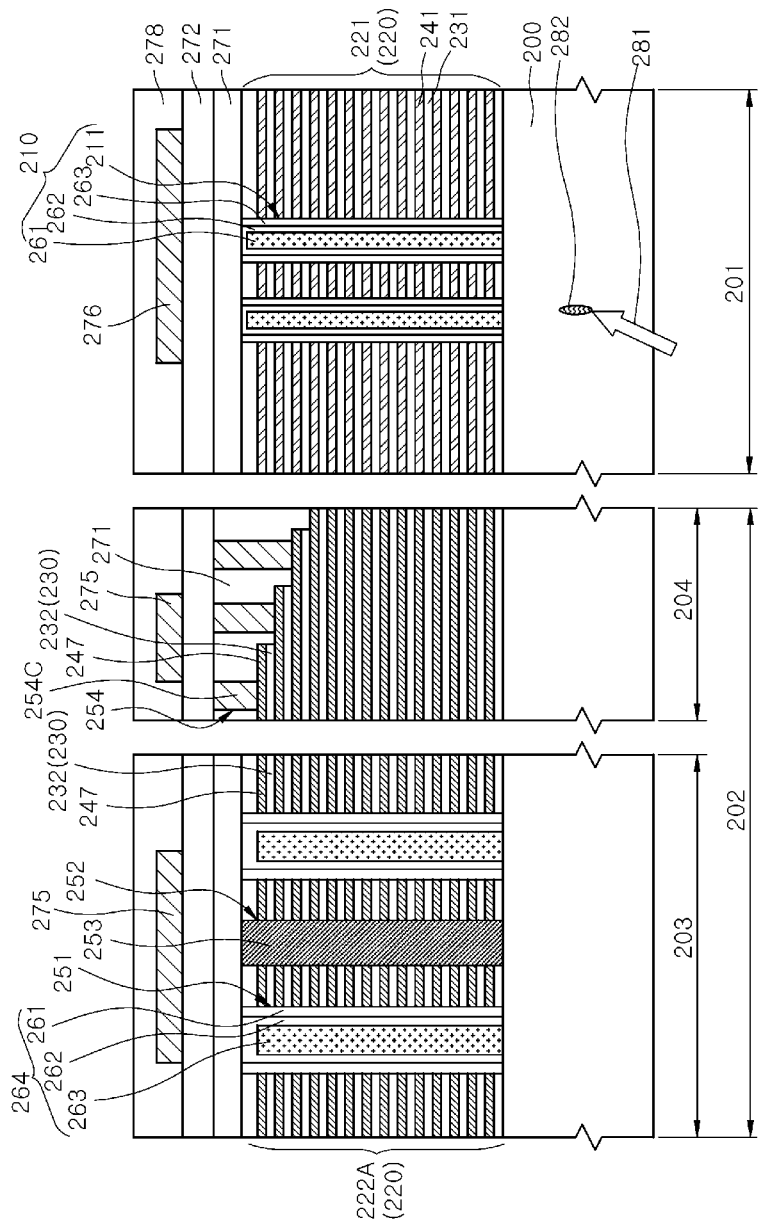
Figure 27:
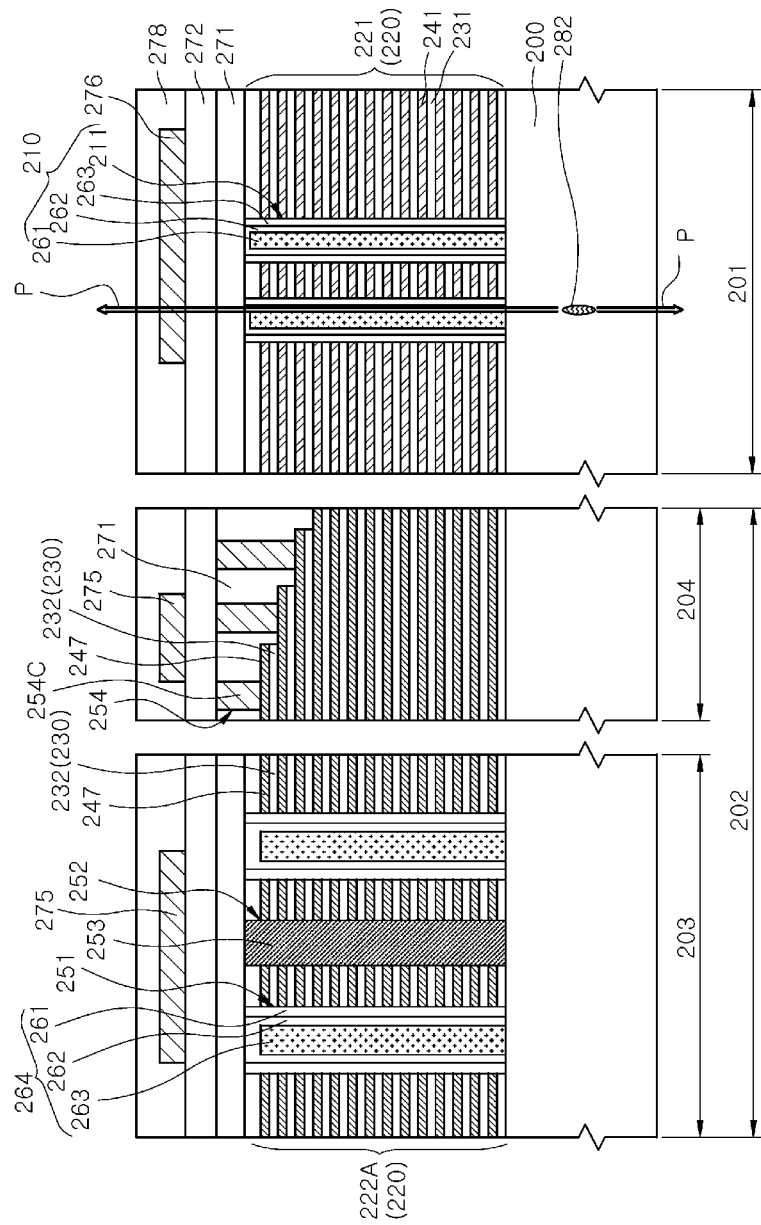
Figure 28:
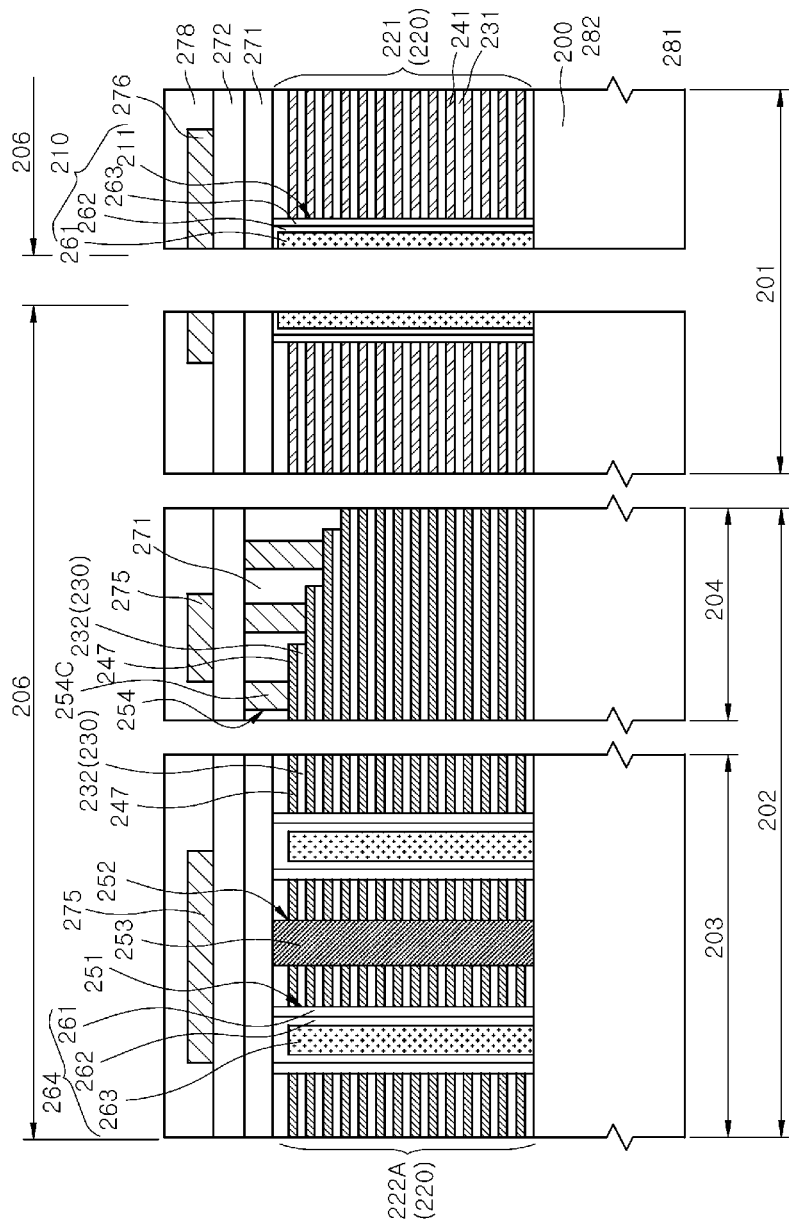

Referring to FIGS. 26 to 28, a process of separating semiconductor chips from the semiconductor substrate 200 may be performed. Referring to FIG. 26, initial cracks 282 may be generated by irradiating portions of the scribe lane region 201 of the semiconductor substrate 200 with a laser 281. The portions of the semiconductor substrate 200 in which the cracks 282 are generated may be overlapped with the crack propagation guides 210.

Referring to FIG. 27, the cracks 282 may propagate in a direction substantially perpendicular to the semiconductor substrate 200. The crack propagation direction P in which the cracks 282 propagate may be guided by the crack propagation guides 210.

Referring to FIG. 28, as the cracks (282 of FIG. 27) propagate to completely penetrate the semiconductor substrate 200 and the layer stack 220, the semiconductor substrate 200 may be separated into a plurality of semiconductor chips 206.

FIGS. 29 to 39 are schematic cross-sectional views illustrating process steps of a method of manufacturing a semiconductor chip according to another embodiment of the present disclosure.

Figure 29:
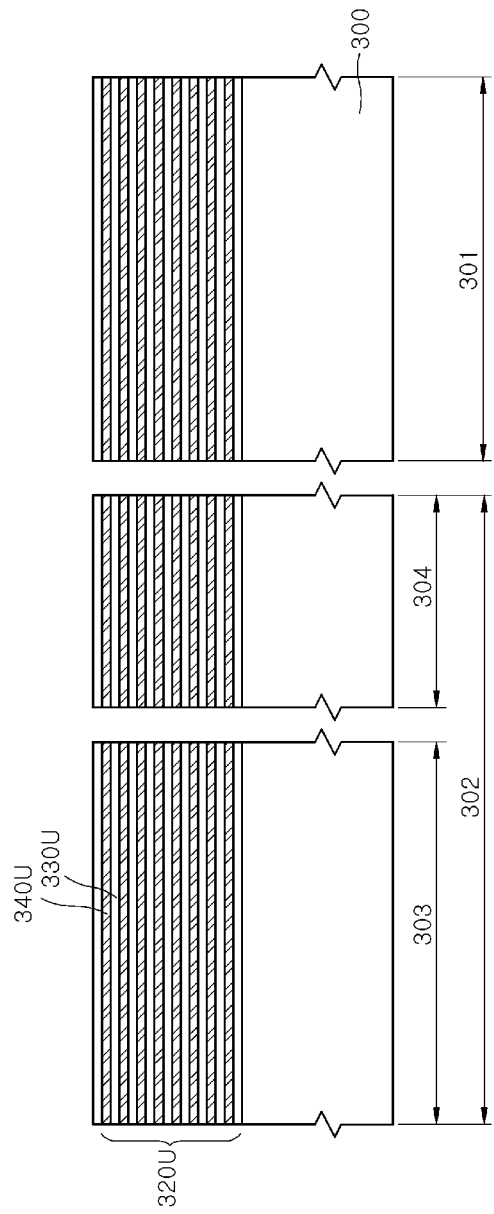
FIGS. 29 to 39 are schematic cross-sectional views illustrating process steps of a method of manufacturing a semiconductor chip according to another embodiment of the present disclosure.

Referring to FIG. 29, a first layer stack 320U may be formed on a semiconductor substrate 300. The semiconductor substrate 300 may include a chip region 302 that is surrounded by a scribe lane region 301. The chip region 302 may include a cell region 303 and a contact region 304. The first layer stack 320U may be formed by alternately and repeatedly stacking a first material layer 330U and a second material layer 340U. The first material layers 330U or the second material layers 340U may be stacked to form a layer stack with several tens of layers. Each of the first material layers 330U may include silicon oxide ($SiO_2$), and each of the second material layers 340U may include silicon nitride ($Si_3N_4$).

Figure 30:
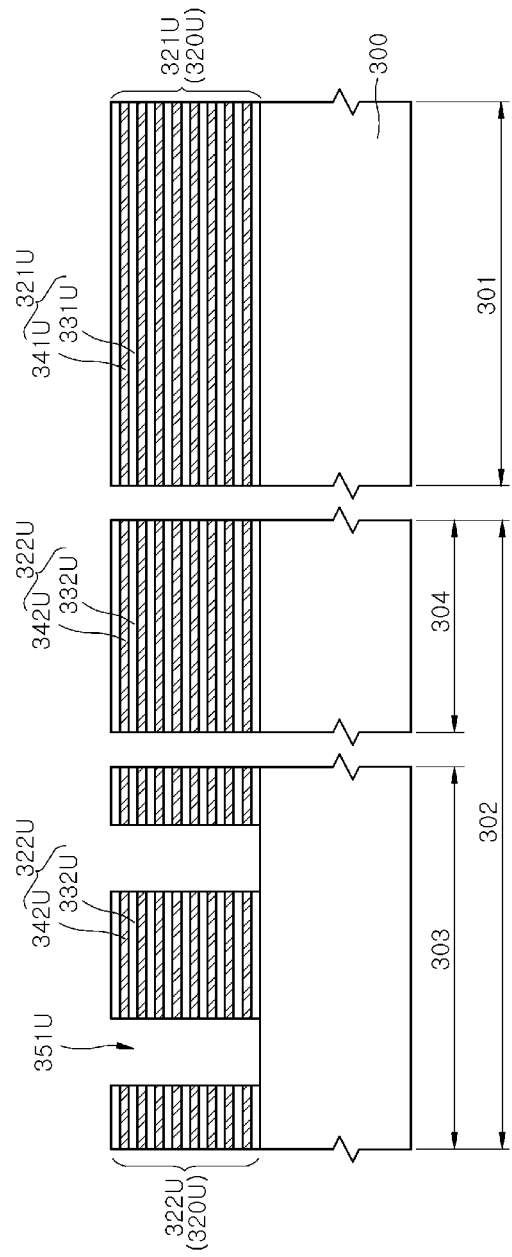

Referring to FIG. 30, first channel holes 351U may be formed to substantially vertically penetrate some portions of second portions 322U of the first layer stack 320U. The first channel holes 351U may substantially vertically penetrate second portions 322U of the first material layers 330U and second portions 342U of the second material layers 340U. The first channel holes 351U may substantially vertically penetrate the second portions 332U of all the first material layers 330U and the second portions 342U of all the second material layers 340, which belong to the second portions 322U of the first layer stack 320U. The second portions 322U of the first layer stack 320U, the second portions 332U of the first material layers 330U, and the second portions 342U of the second material layers 340U may be portions that overlap with the chip region 302 of the semiconductor substrate 300. A first portion 321U of the first layer stack 320U, first portions 331U of the first material layers 330U, and first portions 341U of the second material layers 340U may be portions that overlap with the scribe lane region 301 of the semiconductor substrate 300.

Figure 31:
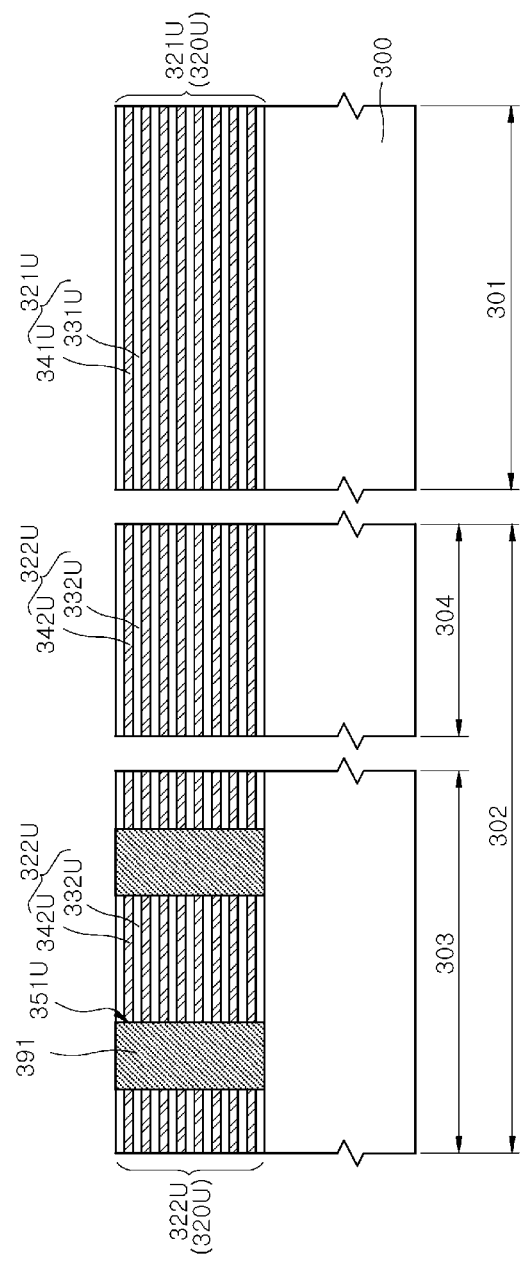

Referring to FIG. 31, sacrificial layers 391 may be formed to fill the first channel holes 351U. Each of the sacrificial layers 391 may include titanium nitride (TiN) or tungsten (W). The sacrificial layers 391 may fill the first channel holes 351U to provide substantially flat surfaces together with the first layer stack 320U in a subsequent process.

Figure 32:
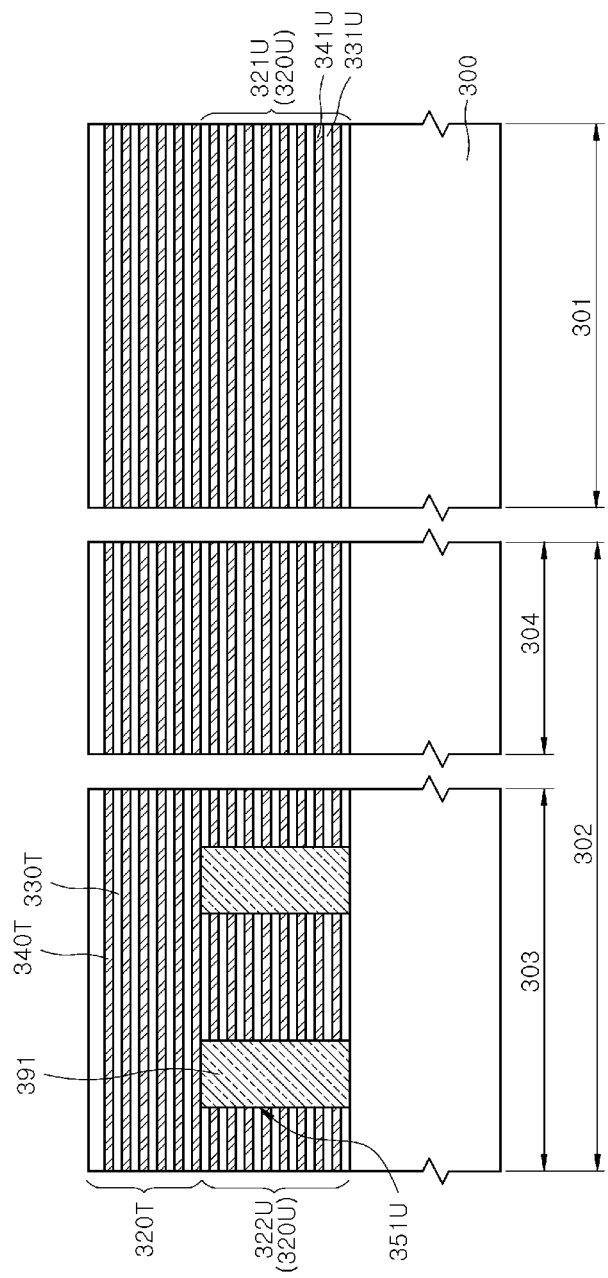

Referring to FIG. 32, a second layer stack 320T may be formed on the first layer stack 320U and the sacrificial layers 391. The second layer stack 320T may be formed to have substantially the same layer stack structure as the first layer stack 320U. The second layer stack 320T may be formed by alternately and repeatedly stacking a third material layer 330T and a fourth material layer 340T. The third material layers 330T and the fourth material layers 340T may be stacked to form a layer stack with several tens of layers. The third material layer 330T may include substantially the same insulating material as the first material layer 330U, and the fourth material layer 340T may include substantially the same insulating material as the second material layer 334U. Each of the third material layers 330T may include silicon oxide ($SiO_2$), and each of the fourth material layers 340T may include silicon nitride ($Si_3N_4$).

Figure 33:
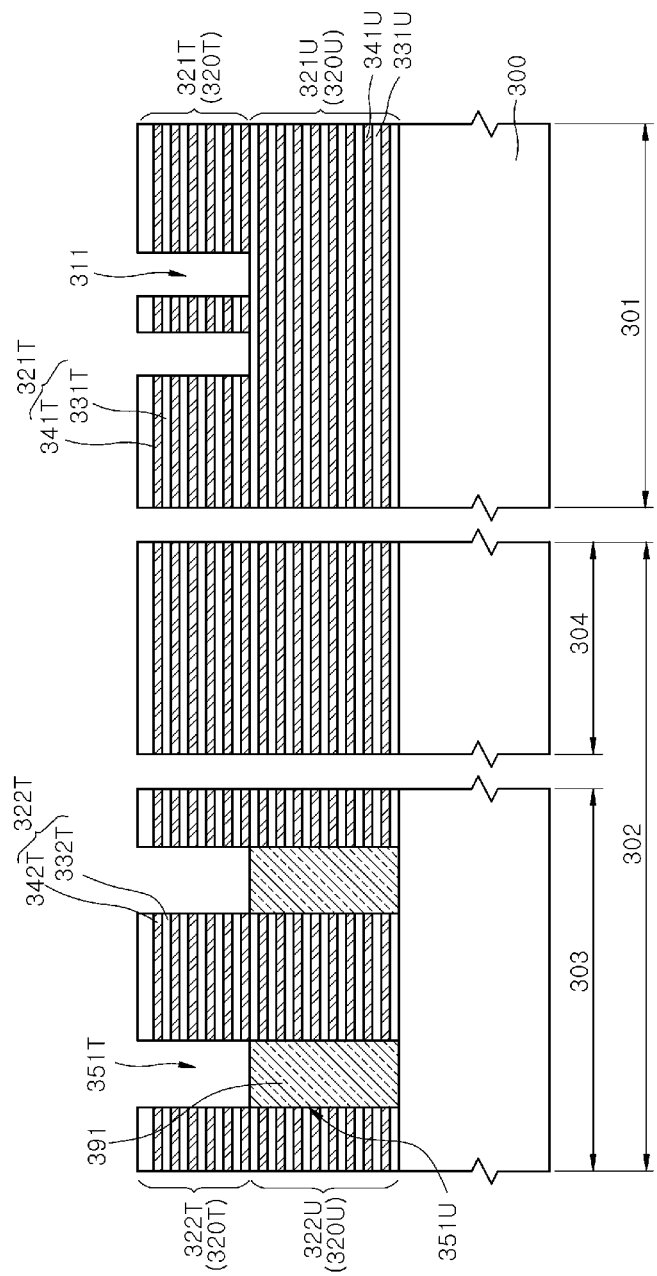

Referring to FIG. 33, second channel holes 351T may be formed to substantially vertically penetrate some portions of the second portion 322T of the second layer stack 320T. The second channel holes 351T may substantially vertically penetrate the second portions 332T of the third material layers 330T and the second portions 342T of the fourth material layers 340T. The second channel holes 351T may overlap with the first channel holes 351U below. The second channel holes 351T may be formed to expose the lower sacrificial layers 391 to the bottom.

While forming the second channel holes 351T, opening holes 311 may be formed along with the second channel holes 351T to overlap with the scribe lane region 301. The openings 311 may be formed to substantially penetrate the first portions 321T of the second layer stack 320T, the first portions 331T of the third material layer 330T, and the first portions 341T of the fourth material layers 340T. The openings 311 are formed together with the second channel holes 351T in a process of forming the second channel holes 351T, so that there is no need to add a separate process step for forming the openings 311.

Figure 34:
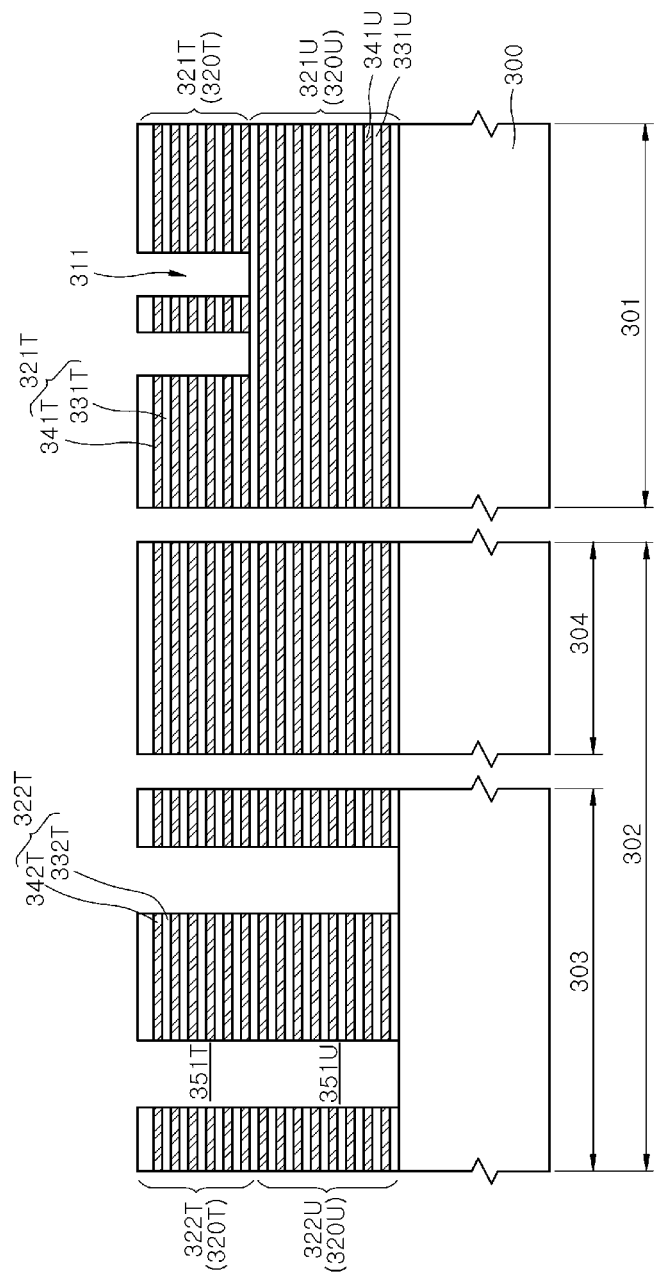

Referring to FIGS. 33 and 34, the sacrificial layers 391 may be selectively removed through the second channel holes 351T. Accordingly, channel hole structures in which the second channel holes 351T and the first channel holes 351U are connected to each other may be formed.

Figure 35:
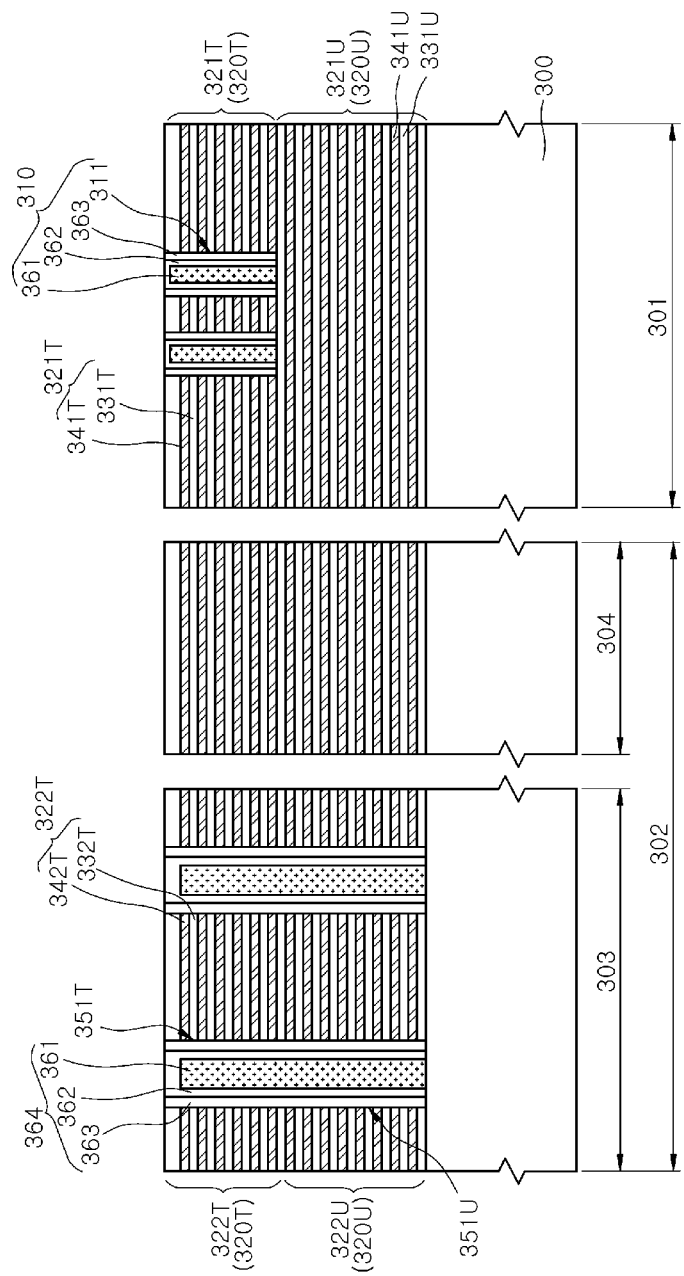

Referring to FIG. 35, vertical channel structures 364 that fill the first and second channel holes 351U and 351T may be formed. A memory layer 361, a channel layer 362, and a filler 363 may be sequentially formed on a sidewall of each of the first and second channel holes 351U and 351T. The memory layer 361 may be a layer in which data is stored by trapping electric charges. The memory layer 361 may include a tunneling layer, a charge trap layer, and a charge blocking layer. The channel layer 362 may include a semiconductor material, such as silicon (Si). The filler 363 may be formed as a layer that fills the first and second channel holes 351U and 351T. The filler 363 may include an insulating material.

While forming the memory layer 361, the channel layer 362, and the filler 363 on the sidewall of each of the first and second channel holes 351U and 351T, at the same time, the memory layer 361, the channel layer 362, and the filler 363 may also be sequentially formed on the sidewall of each of the openings 311. The memory layer 361, the channel layer 362, and the filler 363 that fill each of the openings 311 may constitute crack propagation guides 310 together with the openings 311. As such, the crack propagation guides 310 may be formed in the process of forming the second channel holes 351T and the vertical channel structures 364.

Figure 36:
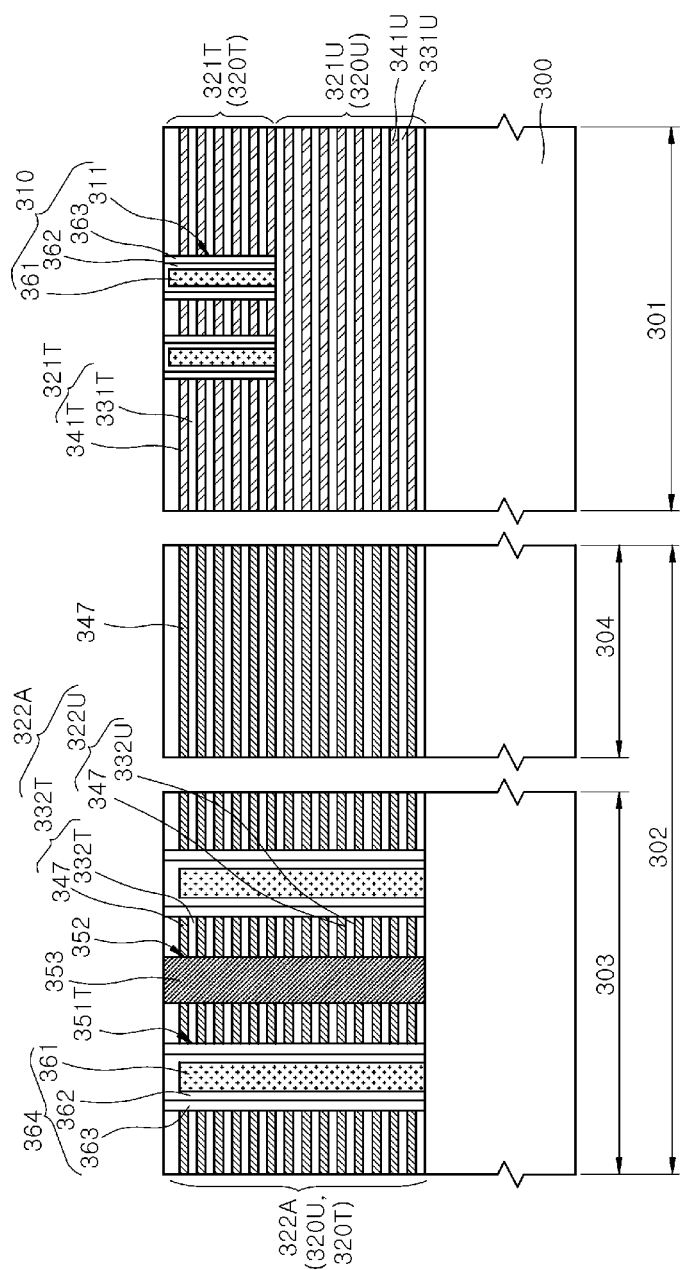

Referring to FIGS. 35 and 36, slits 352 may be formed to substantially vertically penetrate other portions of the second portions (322U and 322T of FIG. 35) of the first and second layer stacks 320U and 320T. The second portions (342U of FIG. 35) of the second material layers (340U of FIG. 35) and the second portions (342T of FIG. 35) of the fourth material layers (340T of FIG. 35) may be selectively etched and removed through the slits 352. A conductive material may be deposited through the slits 352 to fill the spaces from which the second portions (342U of FIG. 35) of the second material layers (340U of FIG. 35) and the second portions (342T of FIG. 35) of the fourth material layers (340T of FIG. 35) are removed with conductive layers 347. In this way, through the slits 352, the second portions 342U of the second material layers 340U and the second portions 342T of the fourth material layers 340T located in the second portions 322U and 322T of the first and second layer stacks 320U and 320T may be replaced with the conductive layers 347. Accordingly, the structure that includes the first and second layer stacks 320U and 320T that overlap with the chip region 302 may be replaced with a structure 322A in which the second portions 332U of the first material layers 330U and the conductive layers 347 are alternately and repeatedly stacked and the second portion 332T of the third material layers 330T and the conductive layer 347 are alternately and repeatedly stacked. Slit patterns 353 that fill the slits 352 may be formed.

Figure 37:
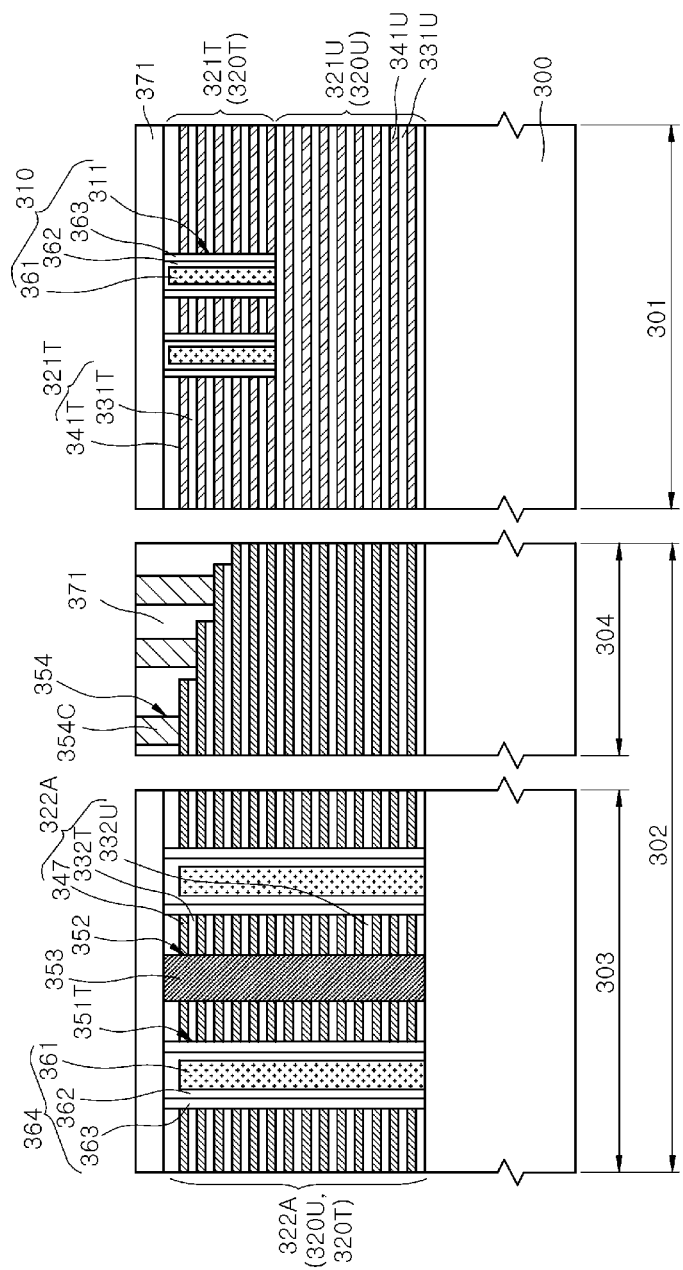

Referring to FIG. 37, contact holes 354 may be formed in the contact region 304 of the chip region 302 of the semiconductor substrate 300. A first insulating layer 371 may be formed on the second layer stack 320T, and the contact holes 354 that penetrates the first insulating layer 371 may be formed. By filling the contact holes 354 with a conductive material, conductive contacts 354C may be formed in the contact holes 354.

Figure 38:
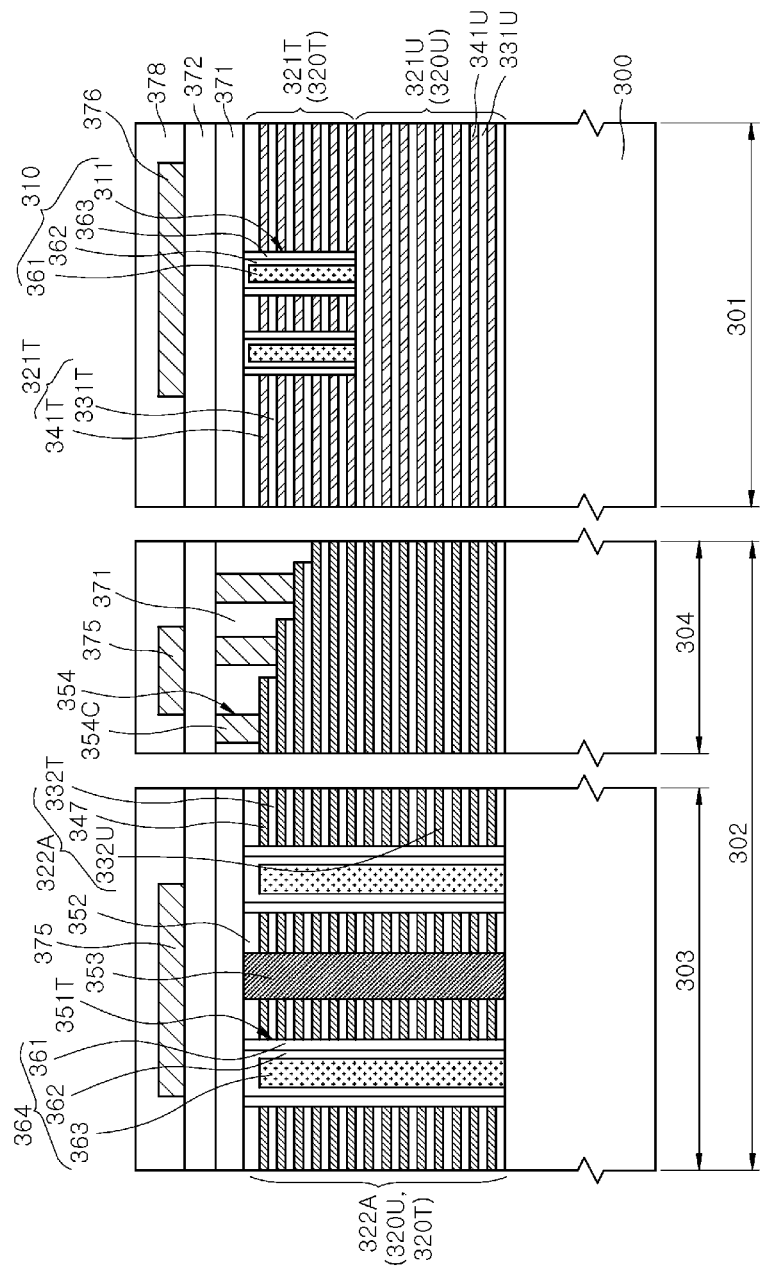

Referring to FIG. 38, a second insulating layer 372 may be formed on the first insulating layer 371 as an interlayer insulating layer. Conductive patterns 375, used as wirings, may be formed on the second insulating layer 372. In the process of forming the conductive patterns 375, a test pattern 376 may be formed over the scribe lane region 301 of the semiconductor substrate 300 together with the conductive patterns 375. The test pattern 376 may be positioned to partially overlap with the crack propagation guides 310. A third insulating layer 378 that covers the conductive patterns 375 and the test pattern 376 may be formed.

Figure 39:
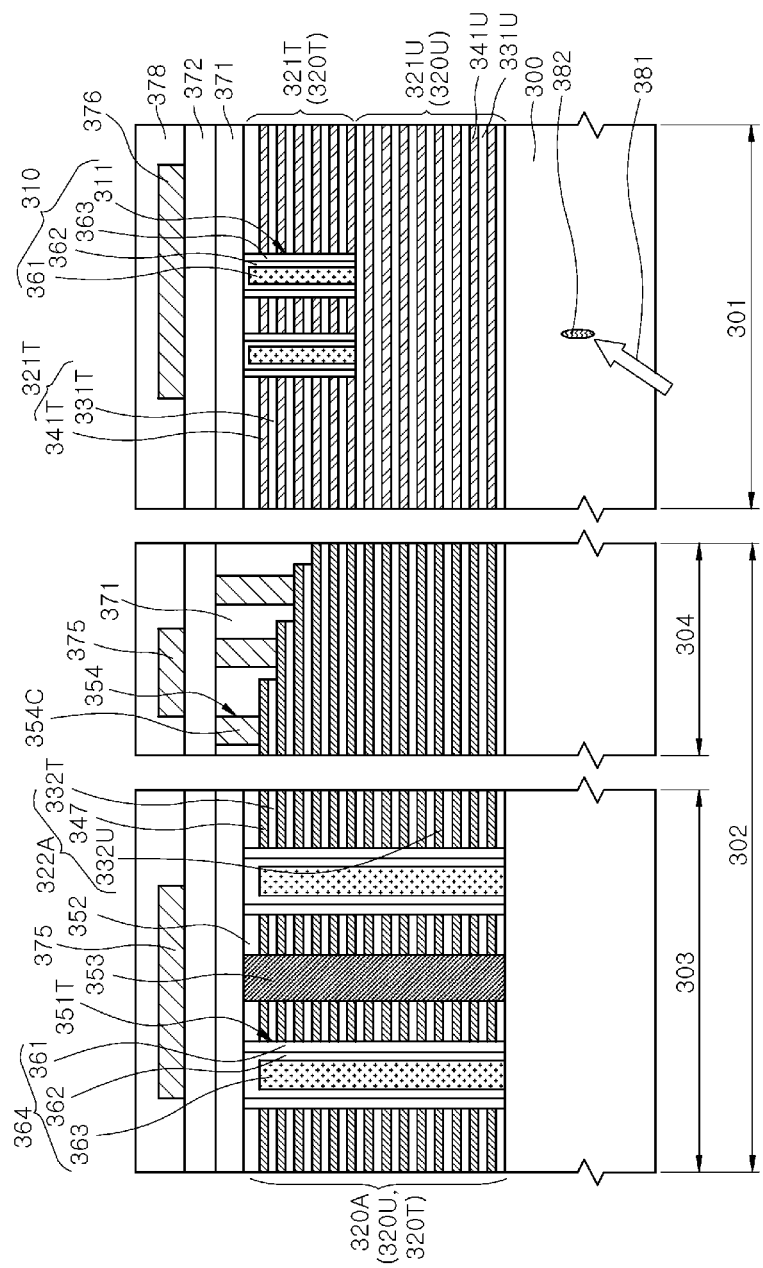

Referring to FIG. 39, a process of separating semiconductor chips from the semiconductor substrate 300 may be performed. Initial cracks 382 may be generated by irradiating portions within the scribe lane region 301 of the semiconductor substrate 300 with a laser 381. The portions of the semiconductor substrate 300 in which the cracks 382 are generated may be overlapped with the crack propagation guides 310. The cracks 382 may be propagated in a direction substantially perpendicular to the semiconductor substrate 300. As the cracks 382 propagate to completely penetrate the semiconductor substrate 300 and the layer stacks 320U and 320T, the semiconductor substrate 300 may be separated into a plurality of semiconductor chips.

Figure 40:
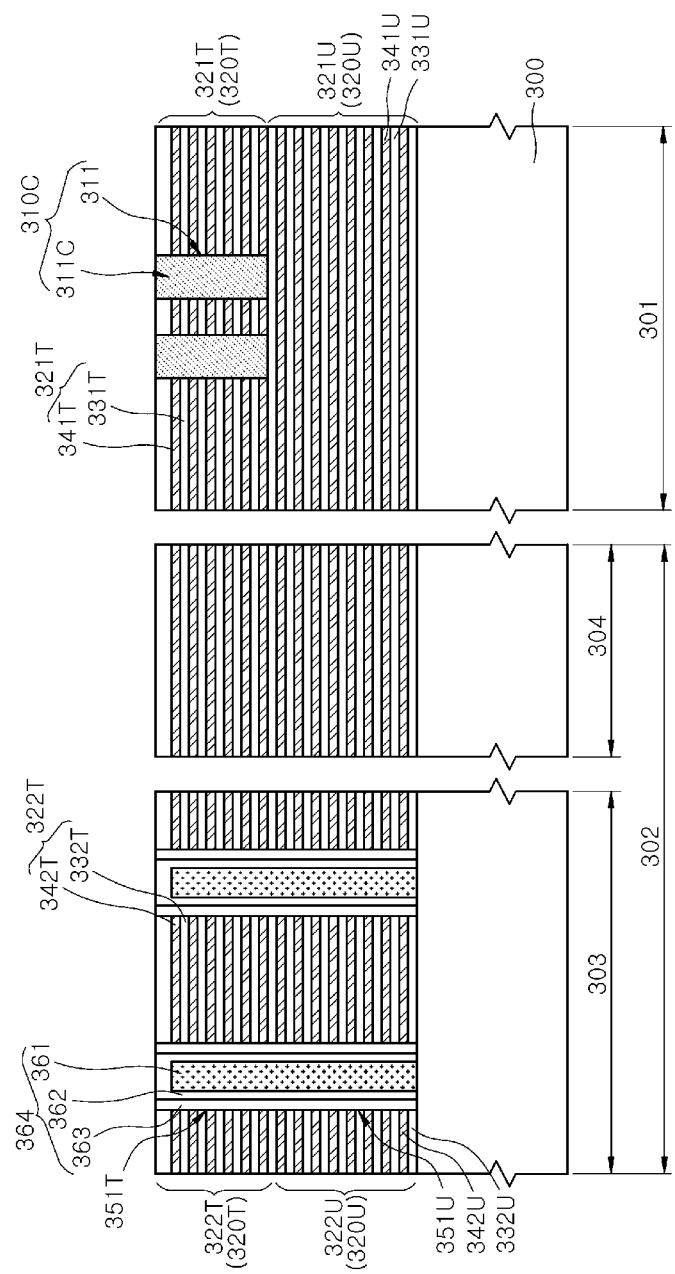
FIGS. 40 and 41 are schematic cross-sectional views illustrating process steps of a method of manufacturing a semiconductor chip according to another embodiment of the present disclosure.
Figure 41:
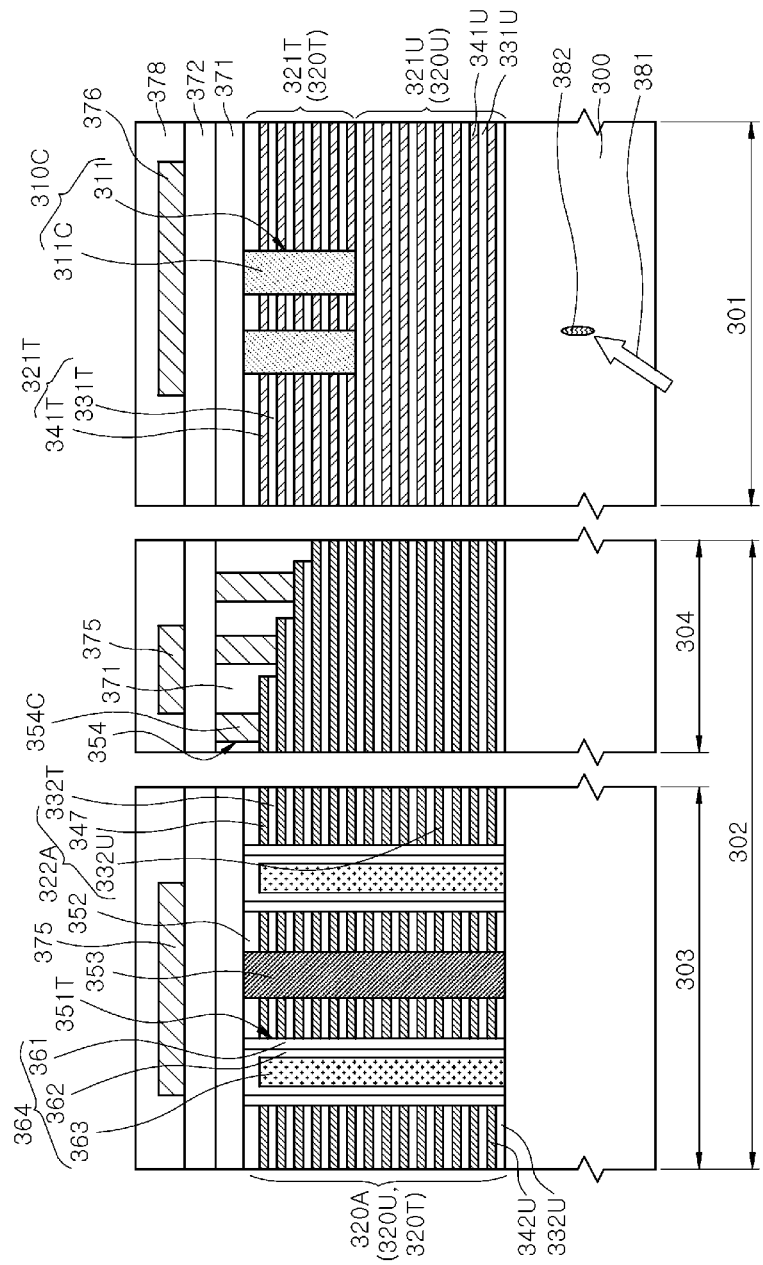

FIGS. 40 and 41 are schematic cross-sectional views illustrating process steps of a method of manufacturing a semiconductor chip according to another embodiment of the present disclosure.

Referring to FIG. 40, while forming channel hole structures in which second channel holes 351T and first channel holes 351U are connected to each other, openings 311 may be formed on a scribe lane region 301 of a semiconductor substrate 300. Vertical channel structures 364 that fill the first and second channel holes 351U and 351T may be formed. Plugs 311C of a conductive material or an insulating material may be formed to fill the openings 311. Crack propagation guides 310C that include the plugs 311C and the openings 311 may be formed. In this way, the crack propagation guides 310C may be formed of different insulating material or different conductive material from the memory layers 361, the channel layers 362, and the fillers 363.

Referring to FIG. 41, a process of separating semiconductor chips form the semiconductor substrate 300 may be performed. Initial cracks 382 may be generated by irradiating portions of the scribe lane region 301 of the semiconductor substrate 300 with a laser 381. The portions of the semiconductor substrate 300 may be overlapped with the crack propagation guides 310C. The cracks 382 may propagate in a direction substantially perpendicular to the semiconductor substrate 300. As the cracks 382 propagate to completely penetrate the semiconductor substrate 300 and the first and second layer stacks 320U and 320T, the semiconductor substrate 300 may be separated into a plurality of semiconductor chips.

FIGS. 42 to 49 are schematic cross-sectional views illustrating process steps of a method of manufacturing a semiconductor chip according to another embodiment of the present disclosure.

Figure 42:
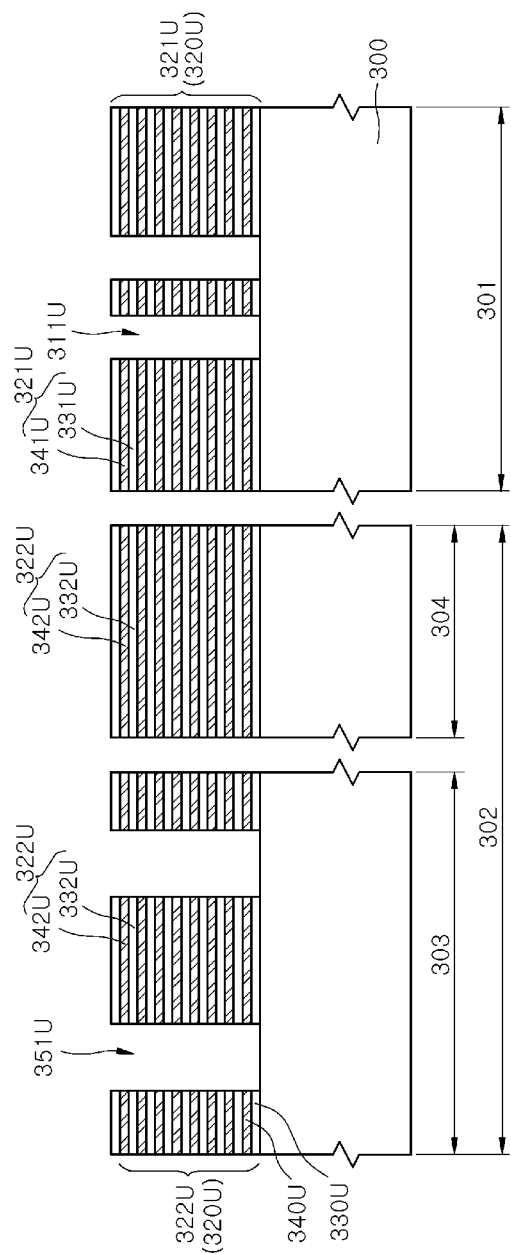
FIGS. 42 to 49 are schematic cross-sectional views illustrating process steps of a method of manufacturing a semiconductor chip according to another embodiment of the present disclosure.

Referring to FIG. 42, a first layer stack 320U may be formed on a semiconductor substrate 300. The semiconductor substrate 300 may include a chip region 302 surrounded by a scribe lane region 301. The chip region 302 may include a cell region 303 and a contact region 304. The first layer stack 320U may be formed by alternately and repeatedly stacking a first material layer 330U and a second material layer 340U. The first material layers 330U and the second material layers 340U may be stacked in several tens of layers. The first material layers 330U may include silicon oxide ($SiO_2$) and the second material layers 340U may include silicon nitride ($Si_3N_4$).

First channel holes 351U may be formed to substantially vertically penetrate portions of the second portion 322U of the first layer stack 320U. The first channel holes 351U may substantially vertically penetrate second portions 332U of the first material layers 330U and second portions 342U of the second material layers 340U. The first channel holes 351U may substantially vertically penetrate the second portions 332U of all the first material layers 330U and the second portions 342U of all the second material layers 340U, which belong to the second portion 322U of the first layer stack 320U. The second portion 322U of the first layer stack 320U, the second portions 332U of the first material layers 330U, and the second portions 342U of the second material layers 340U may be regions that overlap with the chip region 302 of the semiconductor substrate 300.

Openings 311U may be formed to vertically penetrate a first portion 321U of the first layer stack 320U, first portions 331U of the first material layers 330U, and first portions 341U of the second material layers 340U. The openings 311U may be formed in the process step of forming the first channel holes 351U together with the first channel holes 351U. The first portion 321U of the first layer stack 320U, the first portions 331U of the first material layers 330U, and the first portions 341U of the second material layers 340U may be portions that overlap with the scribe lane region 301 of the semiconductor substrate 300. The openings 311U may overlap with the scribe lane region 301 of the semiconductor substrate 300.

Figure 43:
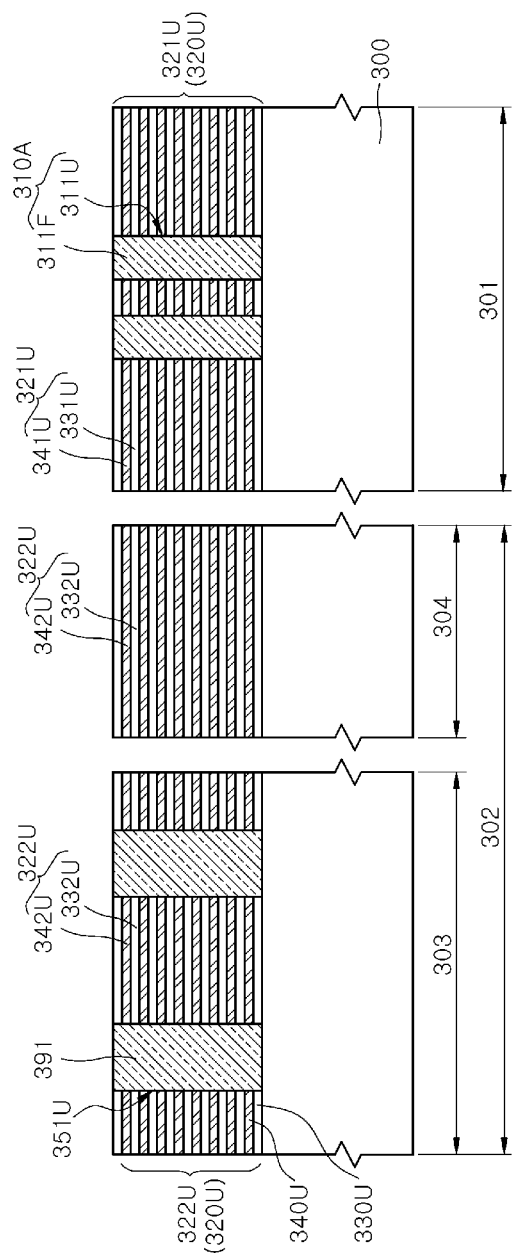

Referring to FIG. 43, first sacrificial layers 391 that fill the first channel holes 351U may be formed. The first sacrificial layers 391 may include titanium nitride (TiN) or tungsten (W). The first sacrificial layers 391 may serve to fill the first channel holes 351U and provide a flat surface together with the first layer stack 320U to a subsequent process. In a process step of forming the first sacrificial layers 391, second sacrificial layers 311F that fill the openings 311U may be formed together with the first sacrificial layers 391. A sacrificial layer that includes tungsten (W) or titanium nitride (TiN) may be deposited to fill the first channel holes 351u and the openings 311U to form the first and second sacrificial layers 391 and 311F with some portions of the sacrificial layer. The openings 311U and the second sacrificial layers 311F that are positioned within the scribe lane region 301 of the semiconductor substrate 300 may constitute crack propagation guides 310A.

Figure 44:
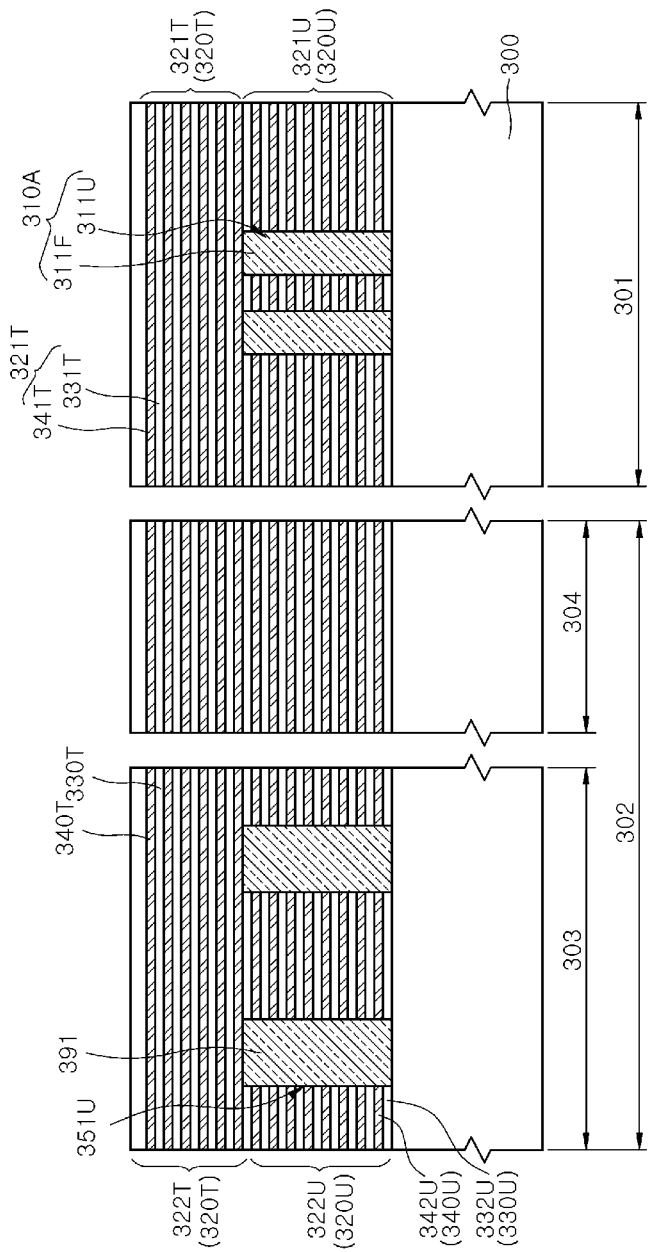

Referring to FIG. 44, a second layer stack 320T may be formed on the first layer stack 320U and the first and second sacrificial layers 391 and 311F.

Figure 45:
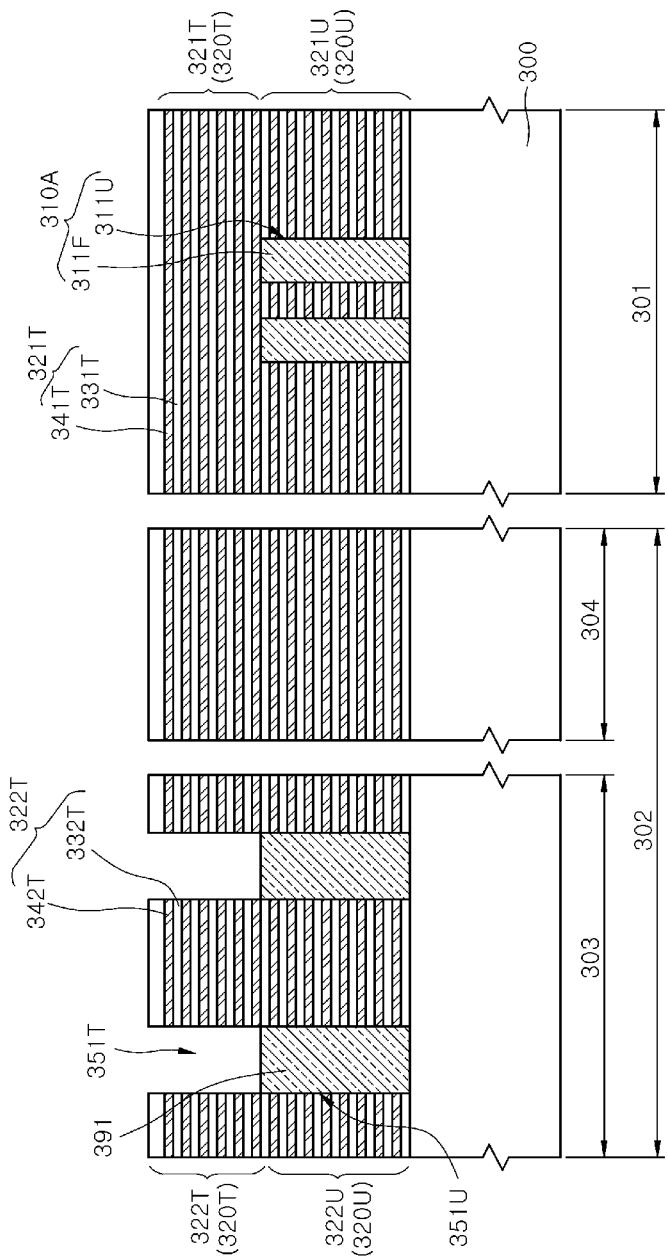

Referring to FIG. 45, as described above with reference to FIG. 33, second channel holes 351T may be formed to substantially vertically penetrate some portions of the second portion 322T of the second layer stack 320T. The openings 311 as described with reference to FIG. 33 might not be formed.

Figure 46:
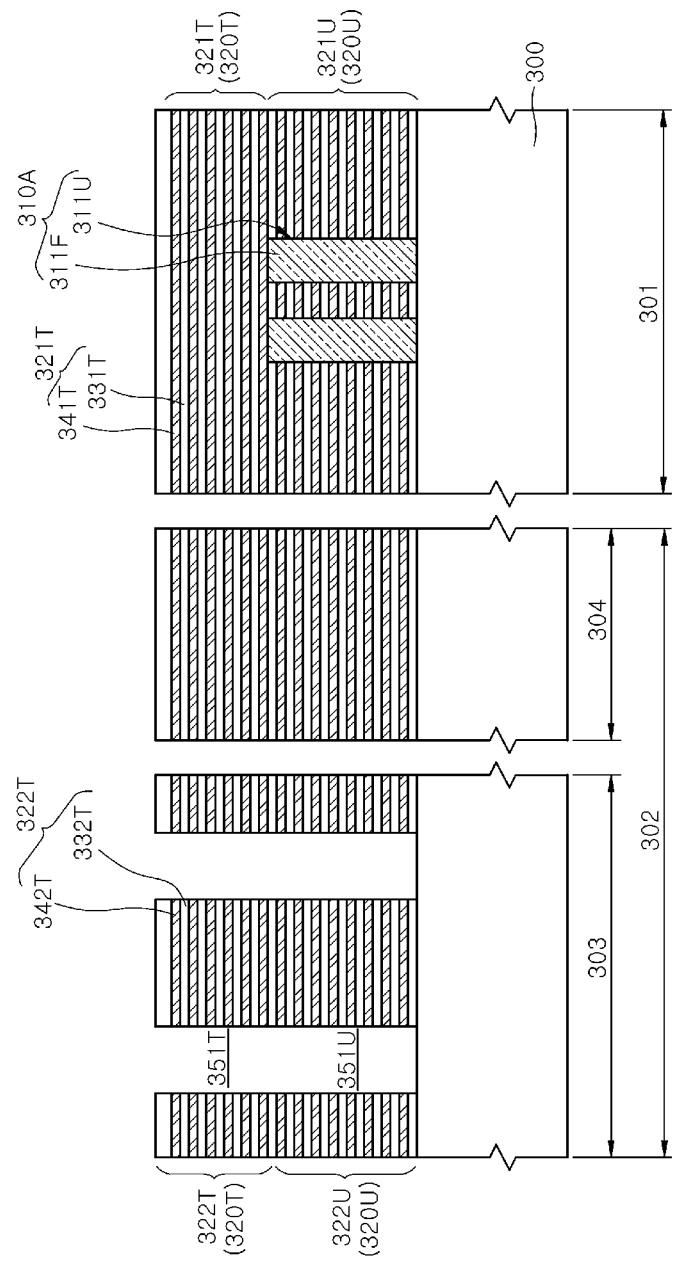

Referring to FIGS. 45 and 46, the first sacrificial layers 391 may be selectively removed through the second channel holes 351T. Accordingly, channel structures in which the second channel holes 351T and the first channel holes 351U are connected to each other may be formed.

Figure 47:
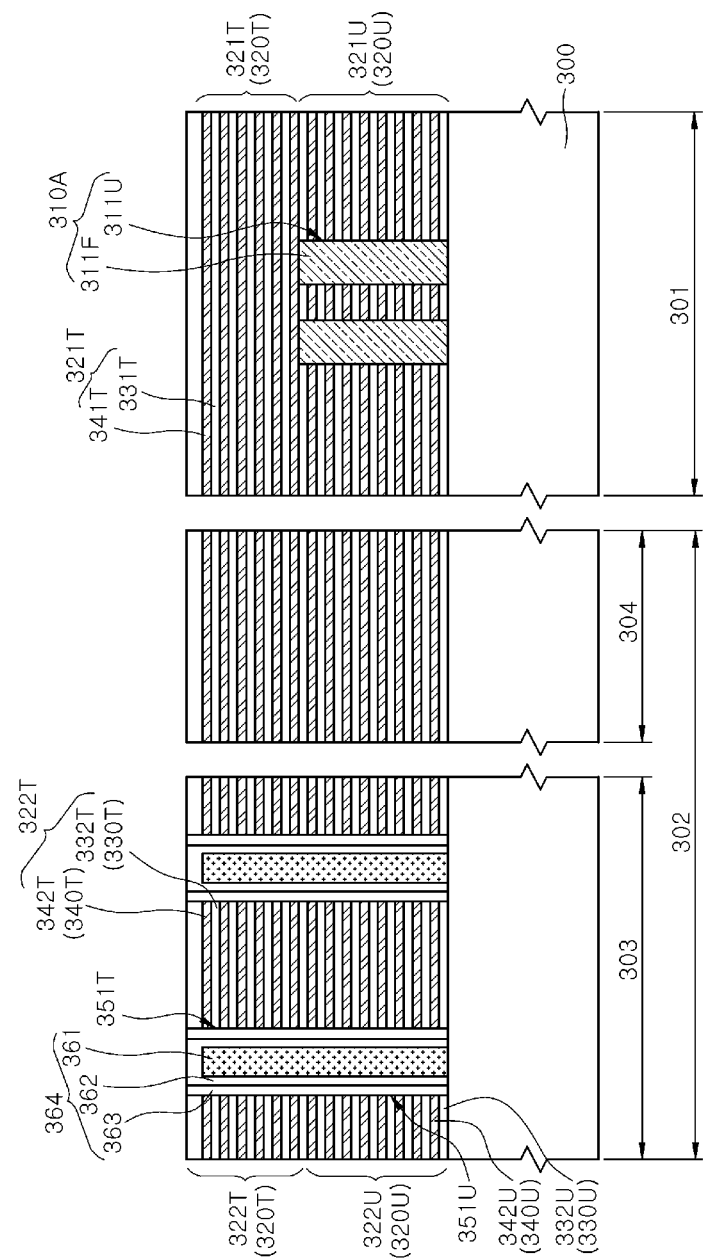

Referring to FIG. 47, vertical channel structures 364 that fill the first and second channel holes 351U and 351T may be formed. A memory layer 361, a channel layer 362, and a filler 363 may be sequentially formed on a sidewall of each of the first and second channel holes 351U and 351T.

Figure 48:
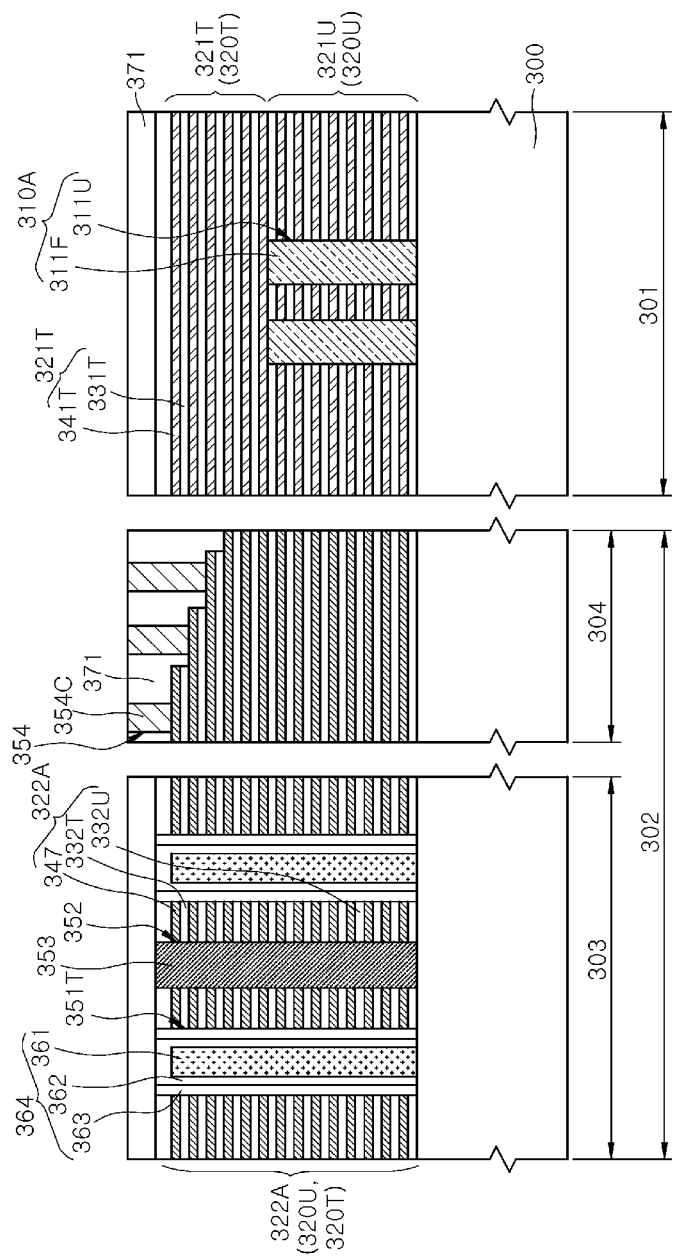

Referring to FIGS. 47 and 48, slits 352 may be formed to substantially vertically penetrate other portions of the second portions 322U and 322T of the first and second layer stacks 320U and 320T. The second portions 342U of the second material layers 340U and the second portions 342T of the fourth material layers 340T may be selectively etched and removed through the slits 352. A conductive material may be deposited through the slits 352 so that the spaces from which the second portions 342U of the second material layers 340U and the second portions 342T of the fourth material layers 340T are removed may be filled with conductive layers 347. In this way, through the slits 352, the second portions 342U of the second material layers 340U and the second portions 342T of the fourth material layers 340T that are positioned in the second portions 322U and 322T of the first and second layer stacks 320U and 320T may be replaced with the conductive layers 347. Accordingly, the structure that includes the second portions 322U and 322T of the first and second layer stacks 320U and 320T that overlap with the chip region 302 may be replaced with a structure 322A in which the second portions 332U of the first material layers 330U and the conductive layers 347 are alternately and repeatedly stacked and the second portions 332T of the third material layers 330T and the conductive layers 347 are alternately and repeatedly stacked. Slit patterns 353 that fill the slits 352 may be formed.

Contact holes 354 may be formed in the contact region 304 of the chip region 302 of the semiconductor substrate 300. A first insulating layer 371 may be formed on the second layer stack 320T, and the contact holes 354 may be formed to penetrate the first insulating layer 371. By filling the contact holes 354 with a conductive material, conductive contacts 354C may be formed in the contact holes 354.

Figure 49:
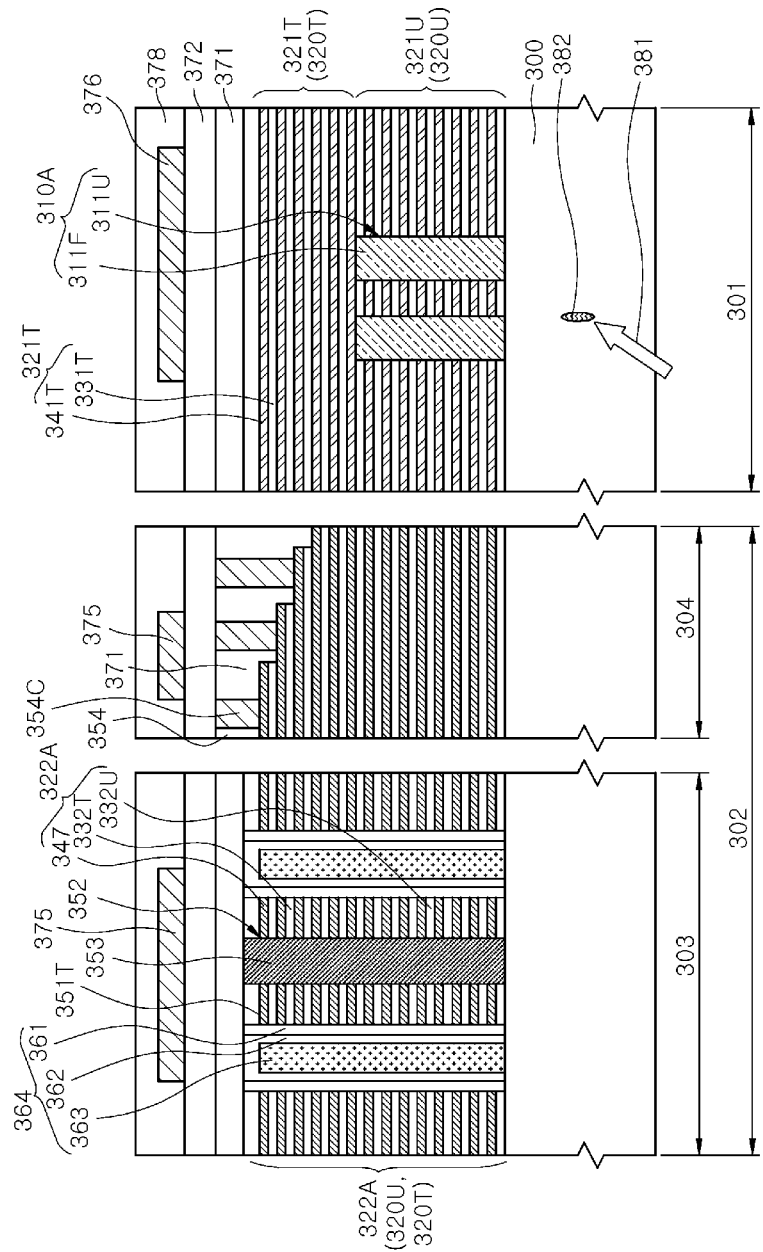

Referring to FIG. 49, a second insulating layer 372 may be formed on the first insulating layer 371 as an interlayer insulating layer. Conductive patterns 375, used as wirings, may be formed on the second insulating layer 372. In the process step of forming the conductive patterns 375, a test pattern 376 may be formed within the scribe lane region 301 of the semiconductor substrate 300 together with the conductive patterns 375. The test pattern 376 may be positioned to partially overlap with the crack propagation guides 310A. A third insulating layer 378 that covers the conductive patterns 375 and the test pattern 376 may be further formed.

A process of separating semiconductor chips from the semiconductor substrate 300 may be performed. Initial cracks 382 may be generated by irradiating portions of the scribe lane region 301 of the semiconductor substrate 300 with a laser 381. The portions of the semiconductor substrate 300 in which the cracks 382 are generated may overlap with the crack propagation guides 310A. The cracks 382 may propagate in a direction substantially perpendicular to the semiconductor substrate 300. As the cracks 382 propagate to completely penetrate the semiconductor substrate 300 and the first and second layer stacks 320U and 320T, the semiconductor substrate 300 may be separated into a plurality of semiconductor chips.

Figure 50:
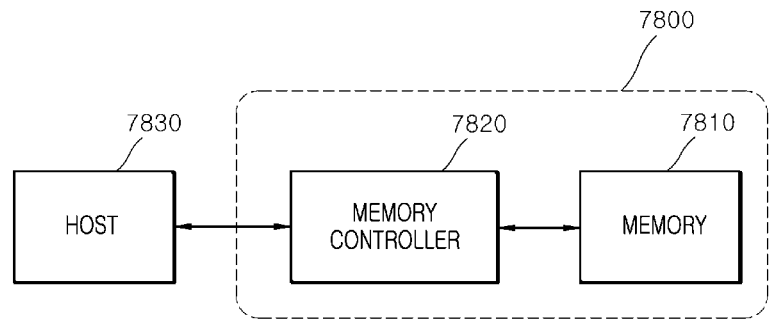
FIG. 50 is a block diagram illustrating an electronic system employing a memory card including a package in accordance with an embodiment of the present disclosure.

FIG. 50 is a block diagram illustrating an electronic system including a memory card 7800 that employs at least one of the semiconductor packages according to the embodiments. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 51:
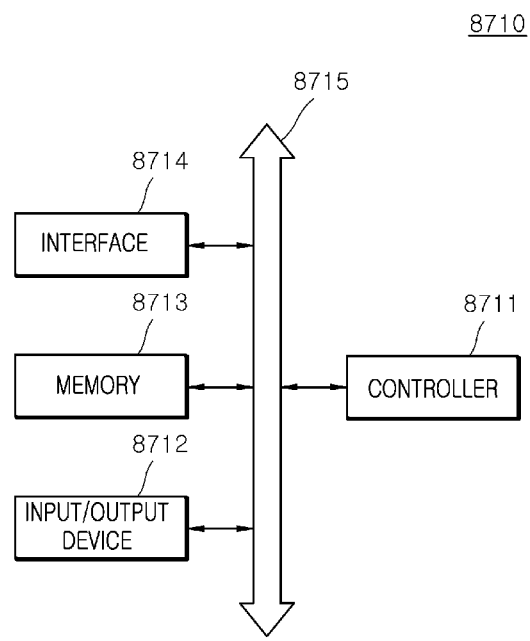
FIG. 51 is a block diagram illustrating an electronic system including a package according to an embodiment of the present disclosure.

FIG. 51 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

The present invention has been mainly examined in the embodiments. Those skilled in the art will appreciate that various modifications, additions and substitutions are possible, without departing from the scope and spirit of the present disclosure and the accompanying claims. Therefore, the disclosed embodiments are to be considered in an illustrative rather than a restrictive sense. The scope of the present disclosure is indicated in the claims rather than the foregoing description, and all differences within the scope equivalent thereto should be construed as being included in the present disclosure.

What is claimed is:

1. A method of manufacturing a semiconductor chip, the method comprising;
   forming a layer stack in which first material layers and second material layers are alternately stacked over a semiconductor substrate that includes a chip region and a scribe lane region; and
   forming crack propagation guides in a first portion of the layer stack within the scribe lane region.

2. The method of claim 1, further comprising:
   irradiating a portion of the semiconductor substrate that overlaps with the crack propagation guides with a laser to generate cracks in the portion of the semiconductor substrate; and
   separating semiconductor chips from the semiconductor substrate by propagating the cracks while a crack propagation direction is guided by the crack propagation guides.

3. The method of claim 1, wherein the first and second material layers include different insulating materials from each other.

4. The method of claim 3, wherein the first material layer includes silicon oxide, and
   wherein the second material layer includes silicon nitride.

5. The method of claim 2, wherein forming the crack propagation guides includes forming openings that substantially vertically penetrate the first portion of the layer stack.

6. The method of claim 5, wherein forming the crack propagation guides further includes forming conductive plugs that fill the openings.

7. The method of claim 5, wherein forming the crack propagation guides further includes forming insulating plugs that fill the openings.

8. The method of claim 5, wherein forming the crack propagation guides further includes forming an insulating layer that closes inlets of the openings to form voids inside the openings.

9. The method of claim 5, further comprising:
   replacing second portions of the second material layers that are positioned in a second portion of the layer stack that overlaps with the chip region with conductive layers, while maintaining first portions of the second material layers that are positioned in the first portion of the layer stack;
   forming contact holes that expose portions of the conductive layers together with the openings; and
   filling the contact holes and the openings with a conductive material to form conductive contacts in the contact holes and conductive plugs in the openings together,
   wherein the crack propagation guides include the openings and the conductive plugs.

10. The method of claim 5, further comprising:
    replacing the second portions of the second material layers that are positioned in the second portion of the layer stack that overlaps with the chip region with conductive layers, while maintaining the first portions of the second material layers that are positioned in the first portion of the layer stack;
    forming contact holes that expose portions of the conductive layers together with the openings;

forming conductive contacts in the contact holes; and
filling the openings with a conductive material to form conductive plugs,
wherein the crack propagation guides include the openings and the conductive plugs.

11. The method of claim 5, further comprising:
replacing the second portions of the second material layers that are positioned in the second portion of the layer stack that overlaps with the chip region with conductive layers, while maintaining the first portions of the second material layers that are positioned in the first portion of the layer stack;
forming contact holes that expose portions of the conductive layers together with the openings;
forming conductive contacts in the contact holes; and
forming an insulating layer that closes inlets of the openings to form voids inside the openings,
wherein the crack propagation guides include the insulating layers providing the openings and the voids.

12. The method of claim 5, further comprising:
forming a channel hole that substantially vertically penetrates the second portion of the layer stack that overlaps with the chip region together with the openings; and
forming memory layers, channel layers, and fillers on sidewalls of the channel hole and the openings,
wherein the crack propagation guides include portions that are positioned in the openings of the memory layers, the channel layers, and the fillers.

13. The method of claim 12, wherein each of the memory layers includes a tunneling layer, a charge trap layer, and a charge blocking layer,
wherein each of the channel layers includes a semiconductor material, and
wherein each of the fillers includes an insulating material.

14. The method of claim 5, wherein forming the crack propagation guides includes forming the memory layers, the channel layers, and the fillers on the sidewalls of the openings.

15. The method of claim 2, wherein the crack propagation guides are formed to partially penetrate the layer stack.

16. A method of manufacturing a semiconductor chip, the method comprising:
forming a first layer stack in which first material layers and second material layers are alternately stacked over a semiconductor substrate that includes a chip region and a scribe lane region;
forming a first channel hole that substantially vertically penetrates a second portion of the first layer stack that overlaps with the chip region;
forming a sacrificial layer that fills the first channel hole;
forming a second layer stack in which third material layers and fourth material layers are alternately stacked on the first layer stack and the sacrificial layer;
forming a second channel hole that substantially vertically penetrates a second portion of the second layer stack that overlaps with the chip region and is connected to the first channel hole together with openings that substantially vertically penetrate a first portion of the second layer stack within the scribe lane region;
removing the sacrificial layer through the second channel hole;
forming memory layers, channel layers, and fillers on sidewalls of the first and second channel holes;
forming crack propagation guides that fill the openings;
irradiating portions of the semiconductor substrate that overlaps with the crack propagation guides with a laser to generate cracks in the portions of the semiconductor substrate; and
separating semiconductor chips from the semiconductor substrate by propagating the cracks while a crack propagation direction is guided by the crack propagation guides.

17. The method of claim 16, wherein the crack propagation guides are formed when the memory layers, the channel layers, and the fillers are formed.

18. The method of claim 16, wherein the crack propagation guides include a different insulating material or a different conductive material from the memory layers, the channel layers, and the fillers.

19. The method of claim 16, wherein each of the memory layers includes a tunneling layer, a charge trap layer, and a charge blocking layer,
wherein each of the channel layers includes a semiconductor material, and
wherein each of the fillers includes an insulating material.

20. The method of claim 16, wherein the sacrificial layer includes titanium nitride (TiN) or tungsten (W).

21. A method of manufacturing a semiconductor chip, the method comprising:
forming a layer stack in which a first material layer and a second material layer are alternately stacked over a semiconductor substrate that includes a chip region and a scribe lane region;
forming a first channel hole that substantially vertically penetrates a second portion of the first layer stack that overlaps with the chip region together with openings that substantially vertically penetrate a first portion of the first layer stack within the scribe lane region;
forming sacrificial layers that fill the first channel hole and the openings to form crack propagation guides with portions of the sacrificial layer that fill the openings;
forming a second layer stack in which a third material layer and a fourth material layer are alternately stacked on the first layer stack and the sacrificial layers;
forming a second channel hole that substantially vertically penetrates a second portion of the second layer stack that overlaps with the chip region and is connected to the first channel hole;
removing another portion that fills the first channel hole of the sacrificial layer through the second channel hole;
forming memory layers, channel layers, and fillers on sidewalls of the first and second channel holes;
irradiating portions of the semiconductor substrate that overlaps with the crack propagation guides with a laser to generate cracks in the portions of the semiconductor substrate; and
separating semiconductor chips from the semiconductor substrate by propagating the cracks while a crack propagation direction is guided by the crack propagation guides.

* * * * *